(12) United States Patent
Hayashi et al.

(10) Patent No.: US 6,174,766 B1
(45) Date of Patent: Jan. 16, 2001

(54) SEMICONDUCTOR DEVICE AND METHOD OF MANUFACTURING THE SEMICONDUCTOR DEVICE

(75) Inventors: Yoshihiro Hayashi; Naoya Inoue; Sota Kobayashi, all of Tokyo (JP)

(73) Assignee: NEC Corporation, Tokyo (JP)

(*) Notice: Under 35 U.S.C. 154(b), the term of this patent shall be extended for 0 days.

(21) Appl. No.: 09/098,436

(22) Filed: Jun. 17, 1998

(30) Foreign Application Priority Data

Jun. 18, 1997 (JP) .................................................. 9-161125

(51) Int. Cl.[7] .................................................. H01L 29/76
(52) U.S. Cl. ..................... 438/241; 438/253; 438/250; 438/258; 438/685; 438/686; 438/393
(58) Field of Search ................................... 438/396, 240, 438/608, 627, 628, 643, 241, 250, 258, 253, 685, 686; 257/295, 310, 311, 296

(56) References Cited

U.S. PATENT DOCUMENTS

| | | | |
|---|---|---|---|
| 5,100,826 | * | 3/1992 | Dennison ............................. 437/52 |
| 5,439,840 | * | 8/1995 | Jones et al. ........................... 437/52 |
| 5,510,654 | * | 4/1996 | Maniar et al. ....................... 257/751 |
| 5,681,425 | * | 10/1997 | Chen ................................. 156/643.1 |
| 5,783,482 | * | 7/1998 | Lee et al. ............................. 438/624 |
| 5,841,160 | * | 11/1998 | Nakamura ............................ 257/295 |
| 5,929,475 | * | 7/1999 | Uemoto et al. ...................... 257/295 |
| 5,981,333 | * | 11/1999 | Parekh et al. ........................ 438/253 |
| 5,985,713 | * | 11/1999 | Bailey .................................. 438/241 |
| 6,057,205 | * | 5/2000 | Wu ....................................... 438/398 |

FOREIGN PATENT DOCUMENTS 5-90606   4/1993 (JP) .
6-275792  9/1994 (JP) .

OTHER PUBLICATIONS

Hiroki Koike et al., "A 60–ns 1–Mb Nonvolatile Ferroelectric Memory with a Nondriven Cell Plate Line Write/Read Scheme", *IEEE Journal of Solid–State Circuits,* vol. 31, No. 11, Nov. 1996, pp. 1625–1634.

* cited by examiner

*Primary Examiner*—Matthew Smith
*Assistant Examiner*—V. Yevsikov
(74) *Attorney, Agent, or Firm*—Sughrue, Mion, Zinn, Macpeak & Seas, PLLC

(57) ABSTRACT

A method for manufacturing a semiconductor device which ensures the reliability of the connection between a metal wiring of the device to a MOS transistor of the device and which enables the metal wiring to be connected to an electrode of a capacitor of the device without any deteriorating a metal oxide dielectric film of the capacitor is provided. In the method, a transistor having a source/drain region and a gate electrode is formed on a semiconductor substrate. Then, a capacitor is formed on the substrate and has an upper capacitor electrode, a lower capacitor electrode, and a metallic oxide dielectric film disposed between the upper capacitor electrode and the lower capacitor electrode. An insulating film is formed over the capacitor such that the insulating film covers the capacitor, and a transistor contact hole is formed through the insulating film for providing an electrical connection to the transistor while the capacitor is covered via the insulating film and not exposed to an atmosphere when the first contact hole is formed. Also, a capacitor contact hole is formed through the insulating film for providing an electrical connection to the capacitor after the transistor contact hole is formed. A device manufactured by the above method is also provided.

7 Claims, 34 Drawing Sheets

SEMICONDUCTOR DEVICE AND METHOD OF MANUFACTURING THE SEMICONDUCTOR DEVICE

FIELD OF THE INVENTION

The present invention relates to a semiconductor device and a method for manufacturing the semiconductor device. More particularly, the invention relates to a semiconductor integrated circuit having a metallic oxide dielectric capacitor and a method of manufacturing the integrated circuit.

BACKGROUND OF THE INVENTION

Previously, a metallic oxide dielectric has been used as a capacitor insulating film of a semiconductor memory device because it has high dielectric properties and/or high ferroelectric properties. For example, the metallic oxide dielectric may contain a layer of bismuth oxide $SrBi_2Ta_2O_9$ or titanium zirconate $(Pb(Ti, Zr)O_3)$ to exhibit the ferroelectric properties. If the metallic oxide dielectric is exposed to a reducing atmosphere, crystallized metal ions are reduced while oxide ions are released, and thus, oxide defects are formed in the dielectric. As a result, various characteristics of the metal oxide dielectric deteriorate (e.g. an increase in leak current, a degradation of remanence characteristics, etc.). Accordingly, when a capacitor having a metallic oxide dielectric is mounted on a silicon integrated circuit, the capacitor should be prevented from being exposed to a reducing atmosphere as much as possible during the manufacturing process of the integrated circuit.

Also, a noble or inert metal such as platinum ("Pt") which resists oxidation should be used as an electrode of the capacitor having the metal oxide dielectric. Therefore, one must be careful to prevent a reaction between such metal forming the capacitor electrode and the metal wiring which is electrically connected to the capacitor electrode. If the two metals react, the properties of the capacitor deteriorate.

In order to better understand the concepts described above and to even further appreciate the achievements of the present invention, three conventional examples will be described below.

The first conventional example is disclosed in H. Kokie, et al., "A 60-ns 1-Mb Nonvolatile Ferroelectric Memory with a Nondriven Cell Plate Line Write/Read Scheme", *IEEE Journal of Solid-State Circuits*, Vol. 31, No. 11, (Nov. 1996). The first conventional example is illustrated in FIGS. 19 to 26 and shows a method of manufacturing a ferroelectric memory device using titanium zirconate ("PZT") as a metal oxide dielectric. As described above, PZT has high ferroelectric properties.

As shown in FIG. 19, the ferroelectric memory device is roughly partitioned into a memory cell array section 34 and a peripheral CMOS circuit section 33. In the memory cell array section 34, ferroelectric capacitors are regularly disposed. Also, the peripheral CMOS circuit section 33 includes CMOS transistor units that each contain a p-type MOS ("PMOS") transistor 8 and an n-type MOS ("NMOS") transistor 7 as a unit.

As shown in FIG. 20, the device is manufactured by providing a silicon substrate 1 having a memory cell array section 34 and a peripheral CMOS circuit section 33. Then, a memory cell array containing n-type MOSFETs is formed in the memory cell array section 33, and PMOS transistors 7 and NMOS transistors 8 are formed in the peripheral CMOS circuit section 33. Each of the MOS transistors in the device comprises a silicon doping layer or a source/drain region formed in silicide and comprises a gate electrode 5.

After the MOS transistors are formed, a silicon oxide film (i.e. an NSG film) 9 is grown over the transistors via a chemical vapor deposition ("CVD") process, and a boron phosphorus added silicon oxide ("BPSG") film 10 is grown on the NSG film 9 via a CVD process. After the BPSG film 10 is grown, it is reflowed and flattened.

Then, as shown in FIG. 21, a Ti electrode adhesive film 11 and a Pt lower capacitor electrode film 12 are sequentially formed on the BPSG film 10 via a sputtering process, and a PZT precursor is formed on the Pt lower capacitor electrode 12 via a spin coating method. Then, the PZT precursor is crystallized into a PZT film 13 by subjecting the precursor to an annealing process at about 600° C. A photoresist 15 having a pattern corresponding to the shape of the Pt lower capacitor electrode 12 of the capacitor is then formed on the PZT film 13.

Then, as shown in FIG. 22, portions of the PZT film 13, the Pt lower capacitor electrode film 12, and the Ti electrode adhesive film 11 are removed via an ion milling process, and the photoresist 15 is peeled off of the remaining portions of the PZT film 13. Afterwards, a first recovery annealing process is conducted in an oxygen atmosphere for eliminating the etching damage caused by the ion milling process and the removal of the photoresist 15.

As shown in FIG. 23, a Pt upper capacitor electrode film 14 is formed via a sputtering process, and a photoresist 15 that is patterned according to the shape of the upper electrode of the capacitor is formed on the film 14. Then, portions of the film 14 are removed by conducting an ion milling process while using the photoresist 15 as a mask to form the upper electrode 14 of the capacitor. As a result, a ferroelectric capacitor 16 is formed via the Ti electrode adhesive film 11, the Pt lower capacitor electrode 12, the PZT film 13 (i.e. the metal oxide dielectric), and the Pt upper capacitor electrode 14. Afterwards, a second recovery annealing process is conducted in an oxide atmosphere to remove the etching damage formed by the ion milling process and the removal of the photoresist 15. As shown in FIG. 24, a capacitor cover insulating film (i.e. a silicon oxide film) 19 is formed on the ferroelectric capacitor 16 via a plasma CVD method using silane gas ($SiH_4$) and oxygen gas as a raw material.

As shown in FIG. 25, transistor contact holes (i.e. first contact holes) 20 and capacitor contact holes (i.e. second contact holes) are formed in the semiconductor device. The first contact holes 20 extend to the gate electrodes and the source/drain regions of the MOS transistors, and the second contact holes 22 extend to the upper capacitor electrode 14 and the lower capacitor electrode 12 of the capacitors 16. Such holes 20 and 22 are created via a patterning process while using a photoresist (not shown) as a mask. After the holes 20 are created, a laminating film 21 consisting of a Ti adhesive film and a first barrier film of TiN is formed over the entire surface via a sputtering method.

In FIG. 26, an Al wiring metal film 26 and a TiN reflection preventing film 25 are sequentially formed on the entire surface. Then, the first layer Al wiring 26, the TiN reflection preventing film 25, and the laminate film 21 are patterned via a known process using a mixed gas consisting of $Cl_2$ and $BCl_3$.

As shown in FIG. 19, an interlayer insulating film 27 is formed on the patterned first layer Al wiring 26, and through-holes 28 are formed in the film 27 that extend to the first layer Al wiring 26. Then, tungsten 32 is embedded in the through-holes 28 by growing tungsten 32 via a CVD method and etching back the tungsten 32. Then, a second layer Al wiring 30 is formed over the interlayer insulating layer 27 and the tungsten 32.

The second conventional example is disclosed in FIG. 13 of Japanese Patent Unexamined Publication No. Hei 6-275792. The second conventional example is illustrated in FIGS. 27 to 31 and shows a method of manufacturing a ferroelectric memory device having a metal oxide dielectric.

As shown in FIG. 27, a BPSG film 10 is formed over MOS transistors and is flattened. Then, a Ti electrode adhesive film 11 is formed on the BPSG film 10, and a Pt lower capacitor electrode film 12 is formed on the adhesive film 11. Then, the portions of the adhesive film 11 and electrode film 12 are removed to form the lower capacitor electrode 12 of the capacitor.

As shown in FIG. 28, a PZT film 13 is grown over the surface of the semiconductor device, and a Pt upper capacitor electrode film 14 is grown over the PZT film 13. Then, a photoresist 15 having a pattern corresponding to the upper capacitor electrode of the capacitor is formed over the Pt upper capacitor electrode film 14, and portions of the PZT film 13 and the electrode film 14 are removed using the photoresist 15. As shown in FIG. 29, the photoresist 15 is removed, and a ferroelectric capacitor 16 is formed by the Pt lower capacitor electrode film 12, the PZT film 13, and the Pt upper capacitor electrode film 14. Subsequently, as shown in FIG. 30, a Ti film is formed on the entire surface of the semiconductor device, and the film is patterned by a dry etching process to form a Ti barrier metal pattern 35 on the Pt lower capacitor electrode film 12 and the Pt upper capacitor electrode film 14.

As shown in FIG. 31, a capacitor cover insulating film 19 is formed over the ferroelectric capacitor 16 via a CVD method, and transistor contact holes (i.e. first contact holes) 21 and capacitor contact holes (i.e. second contact holes) 22 are formed through the insulating film 19. Furthermore, an Al—Si layer is grown on the entire surface of the semiconductor device via a sputtering process, and a first-layer Al wiring 26 is formed by performing a dry etching process on the Al—Si layer.

As shown in the second conventional example, by forming the Ti barrier metal pattern 35 on the Pt lower capacitor electrode film 12 and the Pt upper capacitor electrode film 14 (FIGS. 30 and 31), the first-layer Al wiring 26 is prevented from directly contacting the Pt lower capacitor electrode film 12 and the Pt upper capacitor electrode film 14.

The third conventional example is disclosed in FIG. 1 of Japanese Patent Unexamined Publication No. Hei 5-90606. The third conventional example is illustrated in FIGS. 32 to 34 and shows a method of manufacturing a ferroelectric memory device.

As shown in FIG. 32, an interlayer insulating film 36 is formed over MOS transistors, and a Ti electrode adhesive film 11 and a Pt lower capacitor electrode film 12 are sequentially formed over the interlayer insulating film 36. Then, portions of the adhesive film 11 and electrode film 12 are removed via a patterning process, and a PZT film 13 is grown on the entire surface. Afterwards, the PZT film 13 is etched so that it is slightly larger than the Pt lower capacity electrode film 12.

As shown in FIG. 33, a Pt upper capacitor electrode film 14 and a TiN upper electrode barrier film 37 are sequentially grown on the entire surface of the semiconductor device. Then, the is films 14 and 37 are dry-etched to form an upper capacitor electrode having a laminated structure. Afterwards, as shown in FIG. 34, a capacitor cover insulating film 19 is grown over the entire surface, and transistor contact holes (i.e. first contact holes) 20 and capacitor contact holes (i.e. second contact holes) 22 are formed in the insulating film 19. Also, the first contact holes 20 extend to the MOS transistors, and the second contact holes 22 extend to the TiN upper electrode barrier film 37 of the upper capacitor electrode 14. Then, an Al layer is sputtered on the entire surface of the semiconductor device, and a first-layer Al wiring 26 is formed by dry etching the Al layer.

As shown above in the third conventional example, the upper capacitor electrode is formed from a laminate film comprising a Pt upper capacitor electrode film 14 and a TiN upper electrode barrier film 37 formed on the electrode film 14. Therefore, when the Al wiring 26 is formed, the wiring 26 does not directly contact the Pt upper capacitor electrode 14.

The devices described in the conventional examples above have several disadvantages. For example, in the first conventional example, after the capacitor cover insulating film 19 is formed over the entire surface (FIG. 24), the first contact holes (i.e. transistor contact holes) 20 and the second contact holes (i.e. capacitor contact holes) 22 are simultaneously formed through the insulating film (FIG. 25). When the contact holes are initially being formed, a gas (i.e. a $CF_4$ plasma gas) having a high etching speed and a small selectivity between the insulating film and the silicon doping layer below the insulating film is used to reduce the time required to etch the insulating film. However, in order to ensure that the etching process does not actually etch the silicon doping layer below the insulating film, a gas (i.e. a $CHF_3$ plasma gas) having a low etching rate and a high selectivity between the insulating film and the silicon doping layer is used to finish the etching process. Since a $CHF_3$ plasma gas is used, hydrogen radicals and hydrogen ions in the gas contact the ferroelectric capacitor 16 via the capacitor contact holes 22 and reduce the size of the PZT film 13. As a result, the characteristics of the capacitor 16 are deteriorated.

Also, in a typical LSI manufacturing process, after a photoresist is peeled off of the semiconductor device, an SPM cleaning process and an APM cleaning process are performed to eliminate etching damage. The SPM cleaning process is performed by using a liquid mixture consisting of sulfuric acid and hydrogen peroxide water, and the APM cleaning process is performed by using a liquid mixture consisting of ammonium water and hydrogen peroxide water.

However, in the first conventional example, after the photoresist used to form the contact holes 20 and 22 is peeled off (FIGS. 24 to 25), the Pt lower capacitor electrode film 12 and the Pt upper capacitor electrode film 14 are located at the bottom of the second contact holes (capacitor contact holes) 22. As a result, the SPM cleaning process or the APM cleaning process cannot be performed. Specifically, the SPM and APM cleaning processes use solutions which dissolve small amounts of platinum Pt that diffuse into the doped region and degrade the performance of the transistor. As a result, an organic cleaning process using an organic solvent such as methyl ethyl ketone is used. However, the organic cleaning process is not as effective as the SPM and APM cleaning processes, and thus, an organic fluoride (not shown) deposited in the bottom of the first contact hole (i.e. the transistor contact hole) 20 when the holes 20 were previously etched with $CHF_3$ plasma cannot be sufficiently removed. Therefore, the electrical current flowing from the first layer Al winding 26 to a MOS transistor via the contact holes 20 may be blocked.

Also, in the first conventional example, after the first and second contact holes 20 and 22 are formed, a laminate film 21 containing a Ti adhesive film and a first barrier film (TiN) is grown on the entire surface of the device (FIG. 25). In such case, the Pt upper capacitor electrode film 14 directly contacts the Ti adhesive film at the bottom of the second contact hole (capacitor contact hole) 22. Therefore, Ti is diffused into the Pt upper capacitor electrode film 14 and reaches the surface of the PZT film 13. As a result, the Ti reacts with oxygen in the PZT crystals in the film 13 to form $TiO_x$, and thus, oxygen defects are generated in crystals of the PZT film 13 and deteriorate the characteristics of the transistor 16.

Also, in the first conventional example, the photoresist 15 which is used as a mask to form the first and second contact holes 20 and 22 is removed by directly exposing the photoresist 15 to oxygen plasma using microwaves. In such case, hydrogen contained in an organic compound forming the photoresist 15 is converted into hydrogen radicals and/or hydrogen ions by the microwaves. Thus, the hydrogen radicals and/or ions contact the ferroelectric capacitor 16 via the contact holes 22 and reduce the PZT film 13, and thus, the characteristics of the capacitor 16 are deteriorated.

Also, in the first conventional example, a tungsten plug 32 is formed by embedding tungsten into the through-hole 28 that connects the first Al wiring 26 and second Al wiring 30 via a metal CVD process (FIG. 19). In order to form the tungsten, a $WF_6$ gas is mixed with a silane gas (i.e. $SiH_4$) or a hydrogen gas (i.e. $H_2$) to form the tungsten W. However, during such process, a HF gas or $SiF_xH_y$ gas is created as a byproduct gas which is easily diffused into the PZT film 13 of the capacitor 16. The byproduct gas reacts with the PZT film 13 to create oxygen defects in the film 13, and thus, the characteristics of the capacitor 16 are deteriorated.

With respect to the second conventional example, a capacitor 16 having a Pt upper capacitor electrode film 14 and a lower capacitor electrode film 12 is formed (FIG. 29). Then, a Ti barrier metal pattern 35 is formed on the Pt lower and upper capacitor electrode films 12 and 14 (FIGS. 30). The Ti barrier metal pattern 35 prevents the first Al wiring 26 from directly contacting the electrode films 12 and 14. However, since the Ti barrier metal pattern contains Ti, Ti diffuses into the PZT film 13 and causes oxygen defects to occur in the crystal of the PZT film 13. Also, the PZT crystal is deteriorated when the Ti barrier metal pattern 35 is grown on the ferroelectric capacitor 16 via the sputtering process. As a result, the characteristics of the capacitor 16 are deteriorated.

With respect to the third conventional example 3, the laminate electrode film consisting of the Pt upper capacitor electrode film 14 and the upper electrode barrier film 37 is grown on the PZT film 13, and then, then the electrode film 14 and the barrier film 37 are patterned together to obtain a structure in which the upper electrode barrier film 37 is aligned with the Pt upper capacitor electrode film 14 (FIG. 33). However, in general, after a PZT capacitor 16 is patterned, oxygen atmospheric annealing is conducted to eliminate etching damage. However, in the situation of the third conventional example, since the TiN upper electrode barrier film 37 will oxidize if it is subjected to oxygen, the oxygen annealing process can not be performed after the ferroelectric capacitor 16 is created.

SUMMARY OF THE INVENTION

A first object of the present invention is to provide a semiconductor device and a method of manufacturing the semiconductor device which ensures the reliability of the connection of a metal wiring to a MOS transistor and also enables the metal wiring to be connected to an electrode of a capacitor without deteriorating a metallic oxide dielectric film of the capacitor.

A second object of the present invention is to provide a method of manufacturing a semiconductor device that prevents the metallic oxide dielectric film from being reduced when extending a capacitor contact hole (a second contact hole) to an electrode of the capacitor.

A third object of the present invention is to provide a multilayer wiring structure in which the metallic oxide dielectric films in the structure have not been reduced and deteriorated.

In order to achieve the above and other objects a method of manufacturing a semiconductor device is provided. The method comprises the steps of: (a) forming a transistor having a source/drain region and a gate electrode on a semiconductor substrate; (b) forming a capacitor at least indirectly on said substrate, wherein said capacitor has an upper capacitor electrode, a lower capacitor electrode, and a metallic oxide dielectric film disposed between said upper capacitor electrode and said lower capacitor electrode; (c) forming an insulating film over said capacitor such that said insulating film covers said capacitor; (d) forming a first contact hole through said insulating film which extends to said transistor; (e) forming a composite film comprising an adhesive metal film and a first barrier film over said insulating film and an inner surface of said first contact hole; (f) forming a second contact hole through said adhesive metal film, said first barrier film, and said insulating film which extends to said capacitor; (g) forming a second barrier layer over said composite film and an inner surface of said second contact hole; and (h) forming a metal wiring film over said second barrier film.

In order to further achieve the above and other objects a method of manufacturing a semiconductor device is provided. The method comprises the steps of: (a) forming a transistor having a source/drain region and a gate electrode on a semiconductor substrate; (b) forming a capacitor at least indirectly on said substrate, wherein said capacitor has an upper capacitor electrode, a lower capacitor electrode, and a metallic oxide dielectric film disposed between said upper capacitor electrode and said lower capacitor electrode; (c) forming an insulating film over said capacitor such that said insulating film covers said capacitor; (d) forming a first contact hole through said insulating film which extends to said transistor; (e) forming a composite film comprising an adhesive metal film and a first barrier film over said insulating film and an inner surface of said first contact hole; (f) forming a second contact hole through said adhesive metal film, said first barrier film, and said insulating film which extends to said capacitor, wherein said step (f) is performed after said step (d); (g) forming a second barrier layer over said composite film and an inner surface of said second contact hole; (h) forming a metal wiring film over said second barrier film; and (i) etching said adhesive metal film, said first barrier film, said second barrier film, and said metal wiring film to form a first wiring layer.

In order to even further achieve the above and other objects a method of manufacturing a semiconductor device is provided. The method comprises the steps of: (a) forming a transistor having a source/drain region and a gate electrode on a semiconductor substrate; (b) forming a capacitor at least indirectly on said substrate, wherein said capacitor has an upper capacitor electrode, a lower capacitor electrode, and a metallic oxide dielectric film disposed between said upper capacitor electrode and said lower capacitor electrode;

(c) forming an insulating film over said capacitor such that said insulating film covers said capacitor; (d) forming a transistor contact hole through said insulating film for providing an electrical connection to said transistor while said capacitor is covered via said insulating film and not exposed to an atmosphere when said first contact hole is formed; and (e) forming a capacitor contact hole through said insulating film for providing an electrical connection to said capacitor, wherein said step (d) and said step (e) are not performed simultaneously.

In order to additionally achieve the above and other objects a method of manufacturing a semiconductor device is provided.

The method comprises the steps of: (a) forming a transistor having a source/drain region and a gate electrode on a semiconductor substrate; (b) forming a capacitor at least indirectly on said substrate, wherein said capacitor has an upper capacitor electrode, a lower capacitor electrode, and a metallic oxide dielectric film disposed between said upper capacitor electrode and said lower capacitor electrode; (c) forming an insulating film over said capacitor such that said insulating film covers said capacitor; (d) forming a transistor contact hole through said insulating film for providing an electrical connection to said transistor while said capacitor is covered via said insulating film and not exposed to an atmosphere when said first contact hole is formed; (e) forming a capacitor contact hole through said insulating film for providing an electrical connection to said capacitor, wherein said step (d) and said step (e) are not performed simultaneously; (f) selectively forming a first wiring layer over said insulating film, over said transistor contact hole to provide an electrical connection to said transistor, and over said capacitor contact hole to provide an electrical connection to said capacitor; (g) forming an interlayer insulating layer over said first wiring layer; (h) forming a through hole in said interlayer insulating layer; and (i) forming a second wiring layer over said interlayer insulating layer and said through hole to provide an electrical connection between said first wiring layer and said second wiring layer.

In order to still further achieve the above and other objects a semiconductor device is provided. The semiconductor device comprises: a semiconductor substrate; a transistor having a source/drain region and a gate electrode formed on said semiconductor substrate; a capacitor having an upper capacitor electrode, a lower capacitor electrode, and a metallic oxide dielectric disposed between said upper capacitor electrode and said lower capacitor electrode; a capacitor cover insulating film formed over said capacitor; and a first metal wiring formed over said capacitor cover insulating film; a first composite film having a first adhesive metal film and a first metal oxide barrier film disposed at an insulating film boundary between said capacitor cover insulating film and said first metal wiring and disposed at a transistor boundary which electrically connects said transistor to said first metal wiring; and a said second metal oxide barrier film formed at a capacitor boundary between said capacitor and said metal wiring, wherein said first adhesive metal film is not disposed at said capacitor boundary.

In order to yet further achieve the above and other objects a semiconductor device is provided. The semiconductor device comprises: a substrate; a transistor formed at least indirectly on said substrate; a capacitor which is formed at least indirectly on said substrate and which has an upper capacitor electrode, a lower capacitor electrode, and a metallic oxide dielectric disposed between said upper capacitor electrode and said lower capacitor electrode; a capacitor cover insulating film formed over said capacitor; a first conductive through hole which penetrates said capacitor cover insulating film and extends to said capacitor; and a first wiring layer formed over said capacitor cover insulating layer and integrated with said first conductive through hole via a sputtering method.

BRIEF DESCRIPTION OF THE DRAWINGS

The above objects and advantages of the present invention will become more apparent by describing in detail preferred embodiments thereof with reference to the attached drawing in which.

DETAILED DESCRIPTION OF THE PREFERRED EMBODIMENTS

The following description of the preferred embodiments discloses specific configurations and components. However, the preferred embodiments are merely examples of the present invention, and thus, the specific features described below are merely used to more easily describe such embodiments and to provide an overall understanding of the present invention. Accordingly, one skilled in the art will readily recognize that the present invention is not limited to the specific embodiments described below. Furthermore, the descriptions of various configurations and components of the present invention which would have been known to one skilled in the art are omitted for the sake of clarity and brevity.

Figure 1:
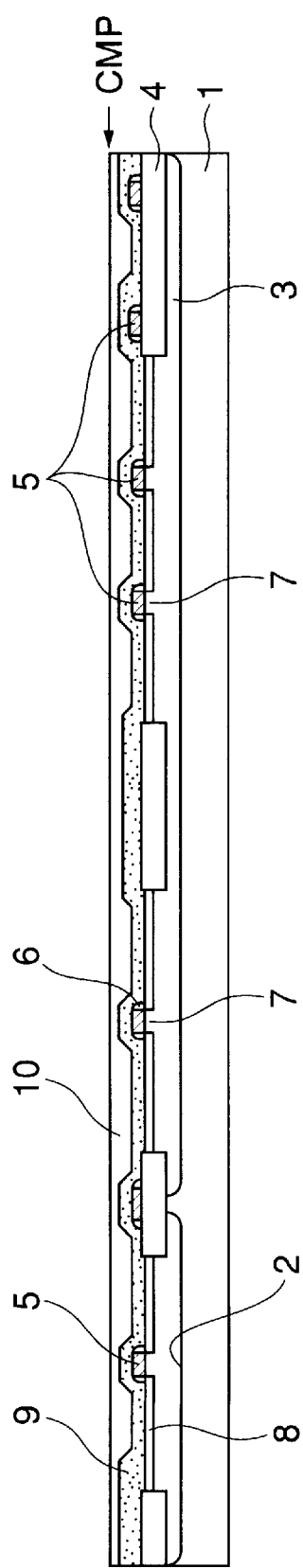
FIG. 1 is a cross-sectional view of a first step in a process according to a first embodiment of the present invention.

FIGS. 1 to 13 illustrate a first embodiment of the present invention. As shown in FIG. 1, a silicon substrate 1 is provided, and phosphorus ions are implanted into the silicon substrate 1 to form an n-well 2. Subsequently, boron is implanted into the silicon substrate 1 to form a p-well 3. Then, the surface of the silicon substrate 1 is oxidized to depth of about 10 nm to form a silicon oxide layer (not shown), and a first silicon nitride film (not shown) is grown on the silicon oxide nitride layer (not shown) to a thickness of about 100 nm. Afterwards, the silicon nitride film (not shown), the silicon oxide layer (not shown), and the silicon substrate 1 are etched via a dry etching process to form a trench having a depth of about 300 nm. Then, a thermal oxide film (not shown) having a thickness of about 10 nm is formed on the surface of the trench in the substrate 1, channel stop boron ions are obliquely implanted, and a silicon oxide film (not shown) having a thickness of about 60 nm is grown via a bias ERC-CVD method and is embedded in the silicon trench. Then, portions of the silicon oxide film (not shown) are removed via a dry etching process, and a silicon trench pattern is formed using a reticle reverse pattern. Afterwards, the silicon oxide film (not shown) is selectively flattened and polished through a chemical mechanical polishing ("CMP") method until the first silicon nitride film surface and the silicon oxide film surface are identical with each other. Then, the silicon oxide film (not shown) is subjected to a hydrophilic process using an aqueous solution containing cellulose, and a scrub cleaning is performed to wet-etch the first silicon nitride film. As a result of the above process, a trench separation oxide film 4 which is embedded in the silicon substrate is formed.

After the implantation of gate boron ions, a gate oxide film (not shown) having a thickness of about 10 nm is formed via thermal oxidation. Then, a gate polysilicon film having a thickness of about 150 nm is grown via a CVD method, and a gate tungsten silicide film having a thickness of about 150 nm is grown via a sputtering method. The gate polysilicon film and gate tungsten silicide film are etched to form polycide gate electrodes 5.

Afterwards, a side wall oxide film 6 is formed at the side walls of the gate electrodes, phosphorus ions and arsenic ions are implanted in the source/drain region of an NMOS transistor 7, and boron ions are implanted in the source/drain region of a PMOS transistor 8. Then, a non-dope silicon oxide ("NSG") film 9 having a thickness of about 150 nm is grown over the transistors 7 and 8 via a CVD method, and a BPSG film 10 having a thickness of 1000 nm is formed over the NSG film 9 via a CVD method. Subsequently, an annealing process is performed on the BPSG film 10 at about 900° C., and then, the BPSG film 10 is flattened via a CMP method.

Figure 2:
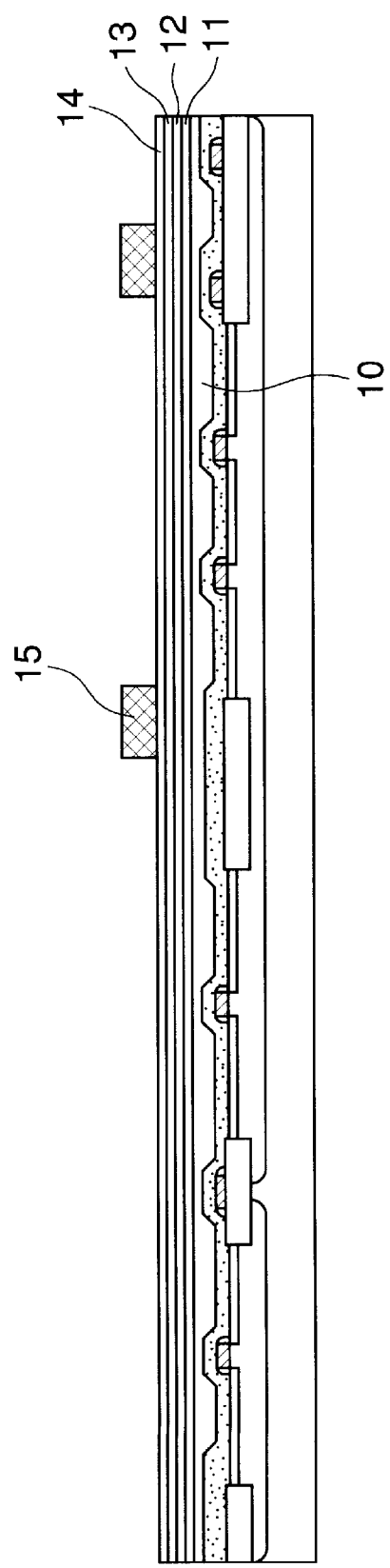
FIG. 2 is a cross-sectional view of a second step in a process according to a first embodiment of the present invention.

As shown in FIG. 2, a Ti electrode adhesion layer 11 having a thickness of about 10 nm is grown on the BPSG film 10, and a Pt lower capacitor electrode film 12 having a thickness of about 200 nm is grown on the adhesion layer 11. Also, a PZT film 13 having a thickness between about 50 and 200 nm is grown on the electrode film 12, and a Pt upper capacitor electrode film 14 is grown on the PZT film 13. The above films 11 to 14 are continuously grown via a sputtering process without being exposed to the atmosphere. The method of sequentially sputtering the lower capacitor electrode film 12, the PZT film 13, and the upper capacitor electrode film 14 and not exposing such films 12, 13, and 14 to the atmosphere is advantageous because foreign matter is prevented from contaminating the boundary between the capacitor electrodes 12 and 14 and the PZT film 13.

Also, an Ar plasma gas is used for sputtering the lower electrode film 12, an RF plasma gas containing a mixture of Ar and $O_2$ and using a PZT target is used for sputtering the PZT film 13, and a plasma gas containing a mixture of Ar and $O_2$ is used for sputtering the Pt upper capacitor electrode film 14. The reason that the Ar and $O_2$ plasma gas is used to etch the upper capacitor electrode film 14 is to ensure that the atmosphere contains a sufficient amount of oxygen throughout the etching process. In particular, if an atmosphere which lacks oxygen is used, oxygen contained in the PZT film 13 will be released into the atmosphere as the electrode film 14 is etched to expose the film 13. The release of oxygen reduces the film 13 and creates defects. Since oxygen is contained in the Ar and $O_2$ plasma gas, it is sufficiently supplied to the PZT film 13 surface such that the film 13 does not release any oxygen to the atmosphere when the electrode film 14 is removed. As a result, oxygen defects do not occur at the boundary between the PZT film 13 and the upper electrode film 14. Afterwards, a patterned photoresist 15 is formed on the Pt upper capacitor electrode film 14.

Figure 3:
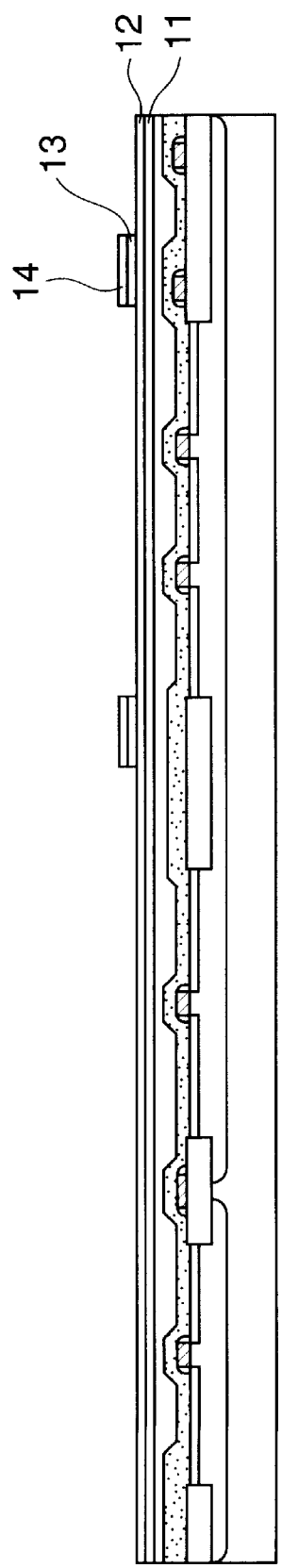
FIG. 3 is a cross-sectional view of a third step in a process according to a first embodiment of the present invention.
Figure 4:
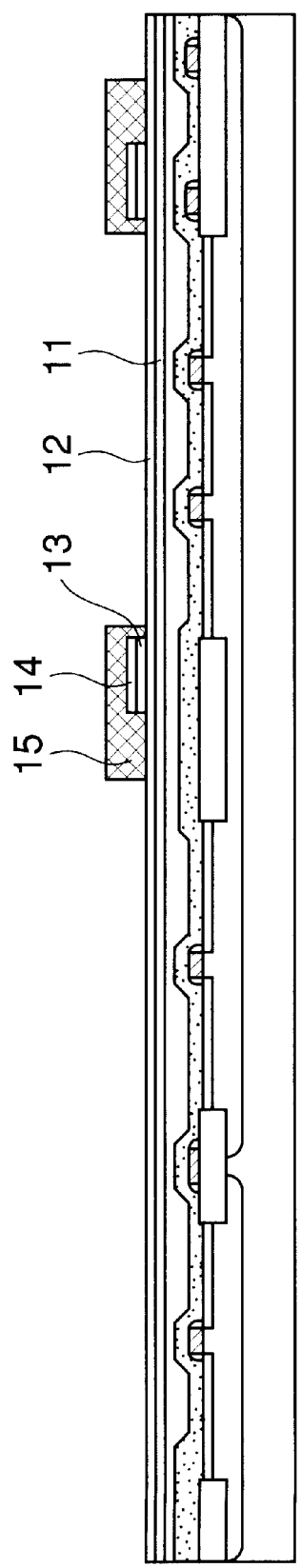
FIG. 4 is a cross-sectional view of a fourth step in a process according to a first embodiment of the present invention.
Figure 5:
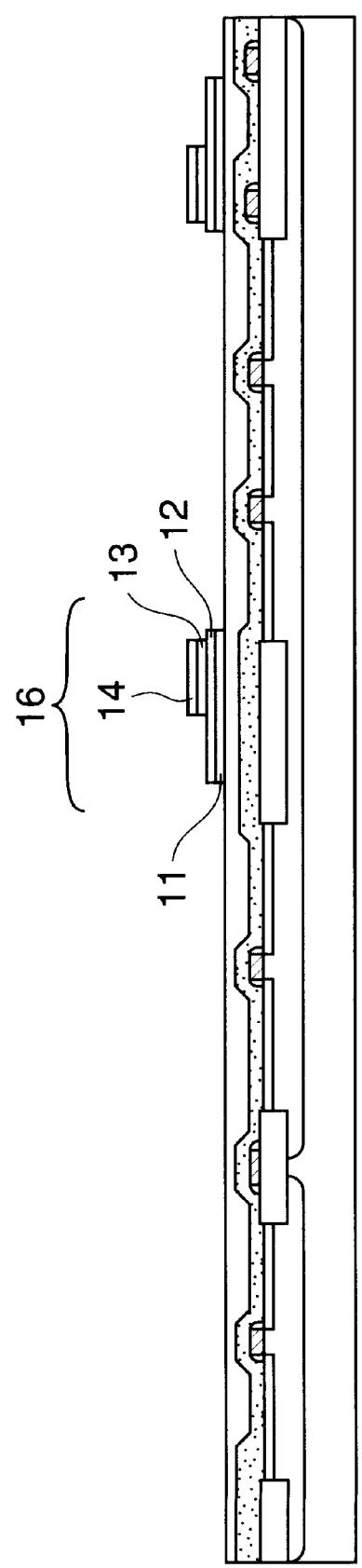
FIG. 5 is a cross-sectional view of a fifth step in a process according to a first embodiment of the present invention.

Then, as shown in FIG. 3, the wafer is moved into a first chamber, and the Pt upper capacitor electrode film 14 is dry-etched with a $Cl_2$ gas plasma. Afterwards, the wafer is moved into a vacuum and then into a second chamber. In the second chamber, the PZT film 13 is dry-etched with a $CF_4$ gas. Then, as shown in FIG. 4, a photoresist 15 having a pattern which corresponds to the desired size of the lower capacitor electrode film 12 is formed over the PZT film 13, the upper capacitor electrode film 14, and the appropriate portion of the lower capacitor electrode film 12. Afterwards, as shown in FIG. 5, the is lower capacitor electrode film 12 is dry-etched via a $Cl_2$ gas plasma, and the adhesive film 11 is also etched. As a result, a ferroelectric film capacitor 16 is formed, and the dielectric of the capacitor (i.e. the PZT film 13) exists in only a region which is disposed between the Pt lower capacitor electrode film 12 and the Pt upper capacitor electrode film 14.

Figure 6:
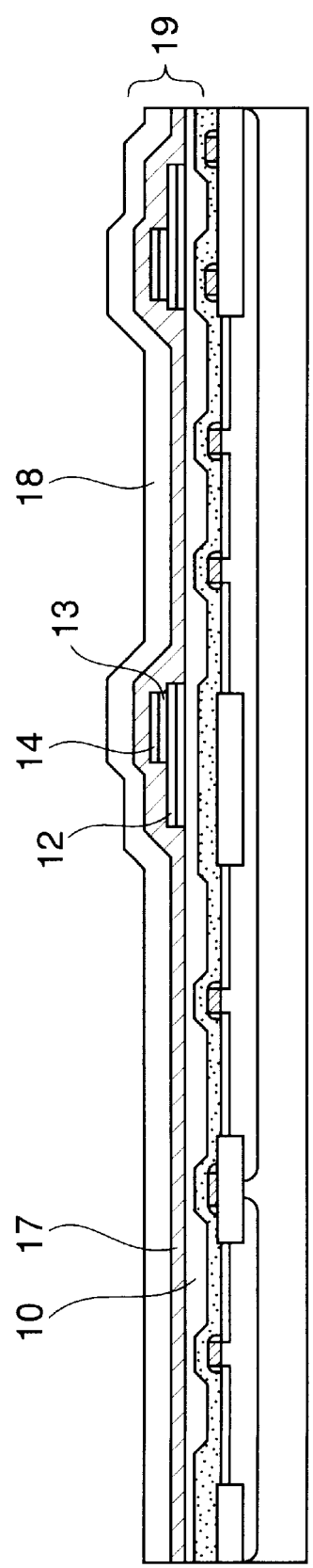
FIG. 6 is a cross-sectional view of a sixth step in a process according to a first embodiment of the present invention.

As shown in FIG. 6, a thermal CVD/silicon oxide film 17 is grown over the ferroelectric capacitor 16 to a thickness of about 200 to 300 nm via a thermal CVD method. In the thermal CVD method, tetraethyl ortho silicate ("TEOS") and ozone are mixed, and the temperature of the substrate 1 is heated to approximately 350° C. to 450° C. As a result, the film 17 is formed, and carbon monoxide and water are produced as a byproduct. Then, a plasma CVD/silicon oxide film 18 is grown over the silicon oxide film 17 to thickness of about 150 nm via a plasma CVD process. In the plasma CVD method, the TEOS is decomposed within oxygen plasma, and the temperature of the substrate 1 is heated to approximately 300° C. to 350° C. As a result, the film 18 is formed, and hydrogen is produced as a byproduct. The films 17 and 18 form a capacitor cover insulating film 19.

As described above, activated hydrogen reduces the PZT film 13 and dramatically deteriorates the characteristics of the film 13. Therefore, in the present example, the silicon oxide film 17 is grown on the capacitor 16 to prevent active hydrogen from seeping into the PZT film 13. Specifically, the water formed during the thermal CVD process does not react with the PZT film 13 and causes the thermal CVD/silicon oxide film 17 to have a high hygroscopicity. Therefore, although active hydrogen is generated when the plasma CVD/silicon oxide film 18 is being grown, the active hydrogen is absorbed by the hygroscopic silicon oxide film 17, and thus, the film 17 acts as a barrier for preventing the hydrogen from seeping into the PZT film 13. In order to appropriately absorb the hydrogen, the plasma CDV/silicon oxide layer 17 preferably has a thickness of 100 nm or more.

Figure 7:
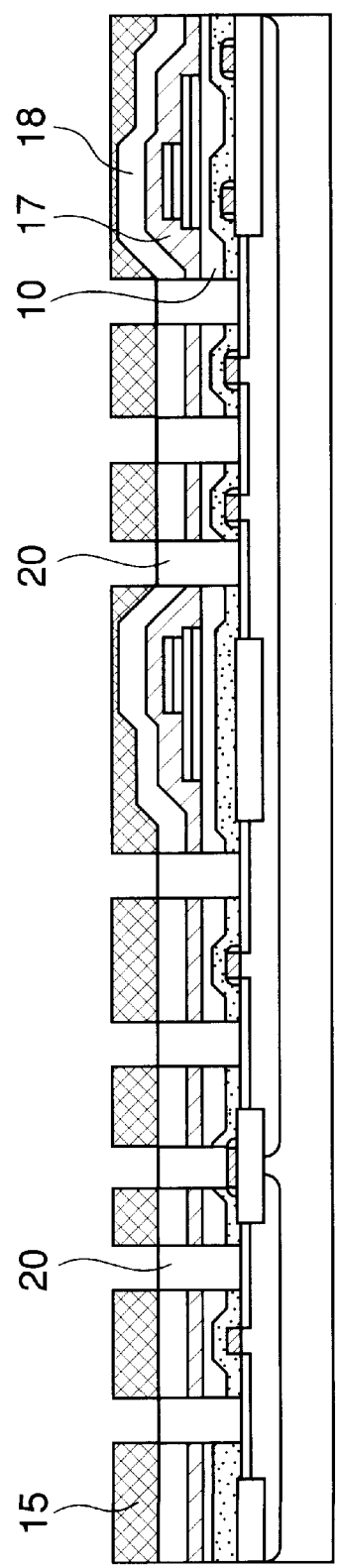
FIG. 7 is a cross-sectional view of a seventh step in a process according to a first embodiment of the present invention.

As shown in FIG. 7, after the capacitor cover insulating film 19 is formed, a photoresist 15 is formed over the film 19.

Then, by using the photoresist 15 as a mask, first contact holes 20 (i.e. transistor contact holes) are formed in the film 19 and extend to the source/drain region and the gate electrodes 5 of the NMOS and PMOS transistors 7 and 8. Although not shown in this embodiment, a silicide wiring (i.e. a bit line) which is connected to the source/drain region and a contact hole which extends to a polysilicon local wiring are also contained in the first contact hole 20.

In the present example, the combined thickness of the plasma CVD/silicon oxide film 18, the thermal CVD/silicon oxide film 17, and the BPSG film 10 formed on the MOS transistors is about 1000 nm. Also, the first contact holes (i.e. the transistor contact holes) 20 are formed in two stages. In the first stage, the silicon oxide film (i.e. the combined films 10, 17, and 18) is dry-etched to a depth of 700 to 800 nm in a $CF_4$ gas (5 mTorr, RF=250 W), until just before the contact hole reaches the silicon doping layer. Then, a fluorine carbonate film which is decomposed from $CHF_3$ gas having a high selectivity is used so that the contact hole can be accurately etched to the silicon doping layer.

In the silicon etching, if a reducing gas such as $CHF_3$ decomposes and generates hydrogen radicals, the oxygen generated during the etching of the silicon oxide film is selectively bonded to hydrogen so that carbon is liable to be deposited. Thus, in the second stage, another reducing gas such as a CO gas may be introduced to raise the selectivity of reducing gas $CHF_3$. In the conventional methods, the CO gas would ordinarily contact the PZT layer 13, reduce the PZT film 13, and deteriorate the characteristics of the film 13. However, since the ferroelectric capacitor 16 is completely covered by the capacitor cover insulating film 19 during the formation of the first contact hole (i.e. the transistor contact hole) 20, the CO gas and other reducing gases did not contaminate or reduce the PZT film 13.

Figure 8:
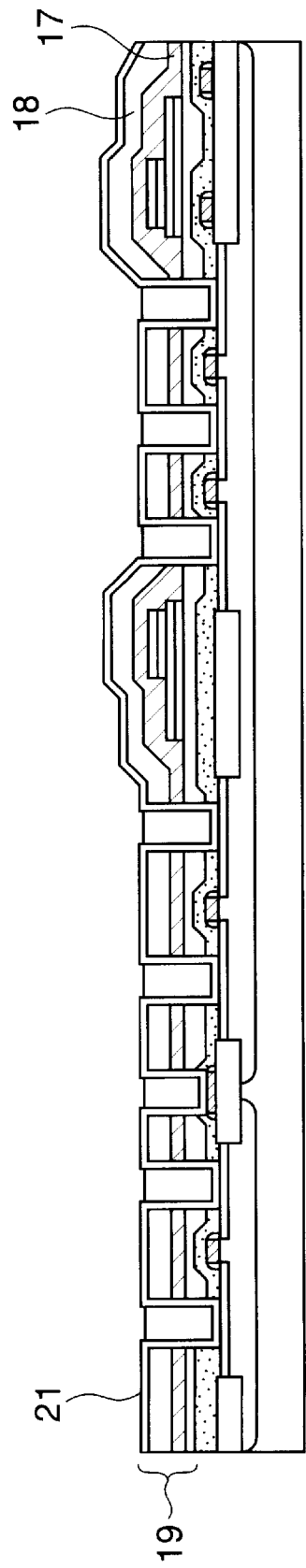
FIG. 8 is a cross-sectional view of a eighth step in a process according to a first embodiment of the present invention.

As shown in FIG. 8, the photoresist 15 is removed, and an SPM cleaning process and APM cleaning process are conducted. Since the ferroelectric capacitor 16 is embedded in the capacitor cover insulating film 19 (i.e. the silicon oxide films 17 and 18), the bottom portion of the first contact hole 20 is not contaminated with Pt from the capacitor electrode films 12 and 14 even though the SPM and APM cleaning processes are performed. After the cleaning processes, a protective silicon oxide film (not shown) having a thickness of about 30 nm in thickness is grown on the entire surface to protect the silicon doping layer during ion implantation. Then, phosphorus ions are implanted at a dose of $5 \times 10^{15}$ atoms/cm$^2$ in the first contact holes 22 that contact the NMOS transistors 7, and $BF_2$ ions are implanted in the entire surface at a dose of $5 \times 10^{14}$ atoms/cm$^2$. Afterwards, the protective silicon oxide film (not shown) is removed by a diluted hydrofluoric acid aqueous solution. Then, a laminate film 21 comprising a Ti adhesive film and the first barrier film of TiN is grown over the entire surface of the semiconductor device. The thickness of the Ti adhesive film is approximately 30 nm, and the thickness of the first barrier film of TiN is approximately 500 nm.

Figure 9:
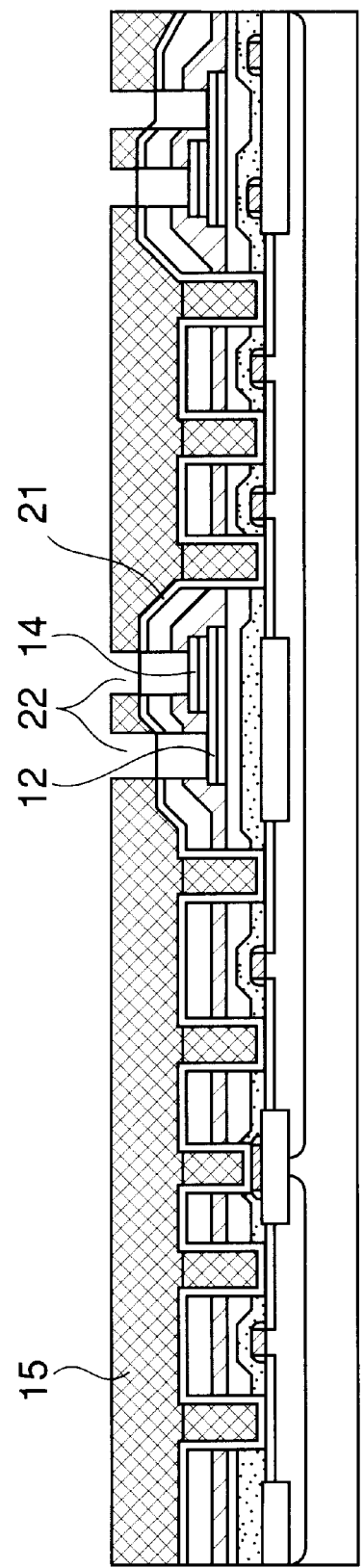
FIG. 9 is a cross-sectional view of a ninth step in a process according to a first embodiment of the present invention.

Subsequently, as shown in FIG. 9, a patterned photoresist 15 is formed over the semiconductor device, and second contact holes (i.e. capacitor contact holes) 22 which extend to the Pt upper capacitor electrodes 14 and the Pt lower capacitor electrodes 12 are formed. During the formation of the second contact holes 22, an etching gas which contains no reducing gas such as $CF_4$ is used, and thus, the deterioration of the PZT film 13 can be prevented.

Then, microwaves are irradiated into an oxygen gas to produce oxygen ions and oxygen radicals, and the photoresist 15 (which is made of carbon) is exposed to the radicals. As a result, the photoresist 15 is made into ash (i.e. converted into carbon dioxide) and removed. Although the oxygen ions are generated during the removal of the photoresist 15, the reactive oxygen ions can be eliminated if they are diffused in a silica tube. Specifically, the oxygen ions quickly disappear by colliding with the silica tube surface, and only the oxygen radicals remain. By converting the photoresist 15 into ash by exposing it only to the oxygen radicals, the damage to the PZT film 13 which would normally result from the oxygen ions is eliminated. Thus, the deterioration of the PZT film 13 due to the active hydrogen that is caused by re-decomposing $H_2O$, which is a reactive product of the photoresist 15 and the oxygen ions, can be prevented. When the semiconductor device having a metallic oxide dielectric capacitor is formed, only the oxygen radicals are preferably applied to the photoresist 15 for converting the photoresist 15 to ash. Also, converting the photoresist 15 to ash and removing it should preferably be done after the capacitor contact hole 22 is formed.

Figure 10:
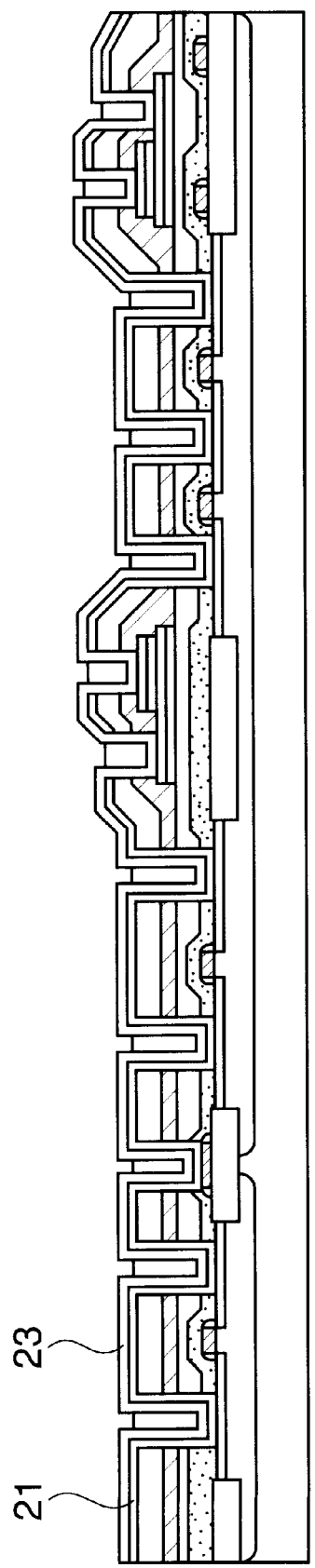
FIG. 10 is a cross-sectional view of a tenth step in a process according to a first embodiment of the present invention.

In FIG. 10, after the photoresist 15 is removed, an organic cleaning process using an organic solvent (e.g. as methyl ethyl ketone (MEK)) is performed. Then, a TiN film is grown on the laminate film 21 to a thickness of about 50 nm to form a second barrier film 23. As a result, a structure in which the laminate film 21 (comprising the Ti adhesive film and the first barrier film) and the second barrier film 23 are laminated with each other is formed on the capacitor cover insulating film 19 to produce a rigid adhesive structure. Similarly, the Ti adhesive film, the first barrier film, and the second barrier film 23 are formed on the surface of the silicon, polysilicon, or silicide which exist at the bottom surface of the first contact holes (i.e. transistor contact holes) 20. In this example, since both the first barrier film and the second barrier film 23 are made of TiN, a Ti/TiN structure is produced when they are laminated. On the other hand, only the second barrier film 23 (i.e. a TiN film) exists at the bottom portion of the second contact holes (i.e. capacitor contact holes) 22. As a result, the Ti contained in the Ti adhesive film is not diffused into the upper capacitor electrodes 14 and does not seep into the surface of the PZT film 13. Thus, the PZT film 13 is not reduced or deteriorated.

After the second barrier film 23 is formed, a lamp annealing process is conducted in a nitrogen atmosphere at 600 to 700° C. for 30 seconds to refine the TiN film 23. The lamp annealing process also activates the phosphorus, arsenic, or boron which has been implanted into the bottom portion of the first contact hole 20.

Figure 11:
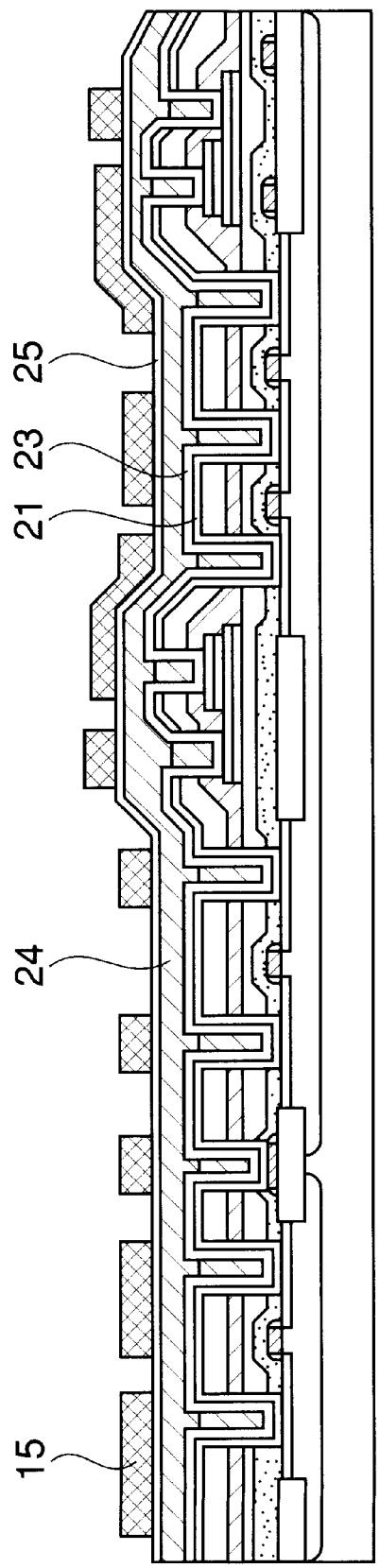
FIG. 11 is a cross-sectional view of a eleventh step in a process according to a first embodiment of the present invention.
Figure 12:
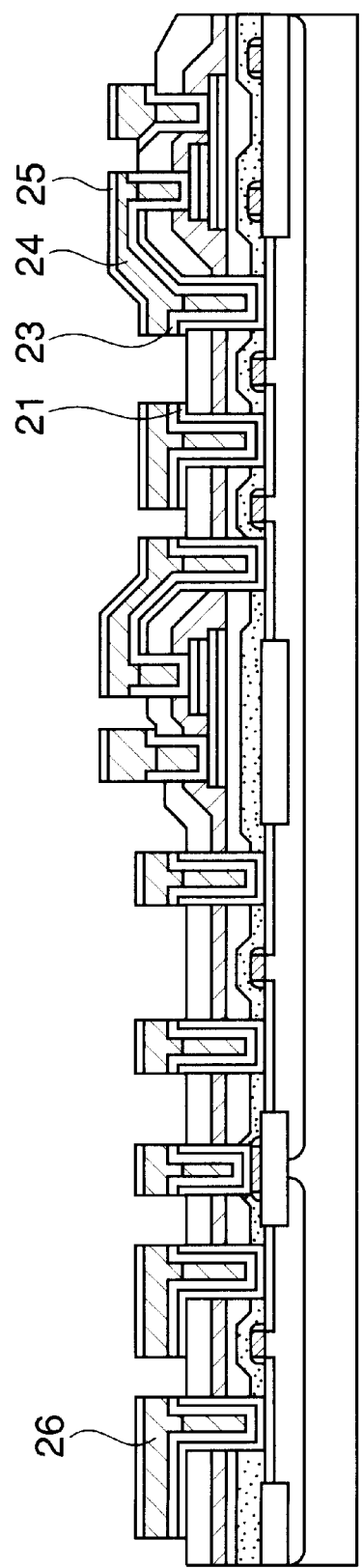
FIG. 12 is a cross-sectional view of a twelfth step in a process according to a first embodiment of the present invention.

Then, as shown in FIG. 11, an Al—Cu film having a thickness of 500 to 800 nm is grown over the second barrier film 23 to produce an Al-Cu wiring metal film 24, and a TiN film having a thickness of 50 nm is formed over the wiring metal film 24 to produce a TiN reflection preventing film 25. Then, a patterned photoresist 15 is formed over the TiN reflection preventing film 25. Afterwards, as shown in FIG. 12, the reflection preventing 28 film 25, the wiring metal film 24, the second barrier film 23, and the laminate film 21 are etched together by oxidizing plasma gas (e.g. choline) to form a first Al wiring 26.

Figure 13:
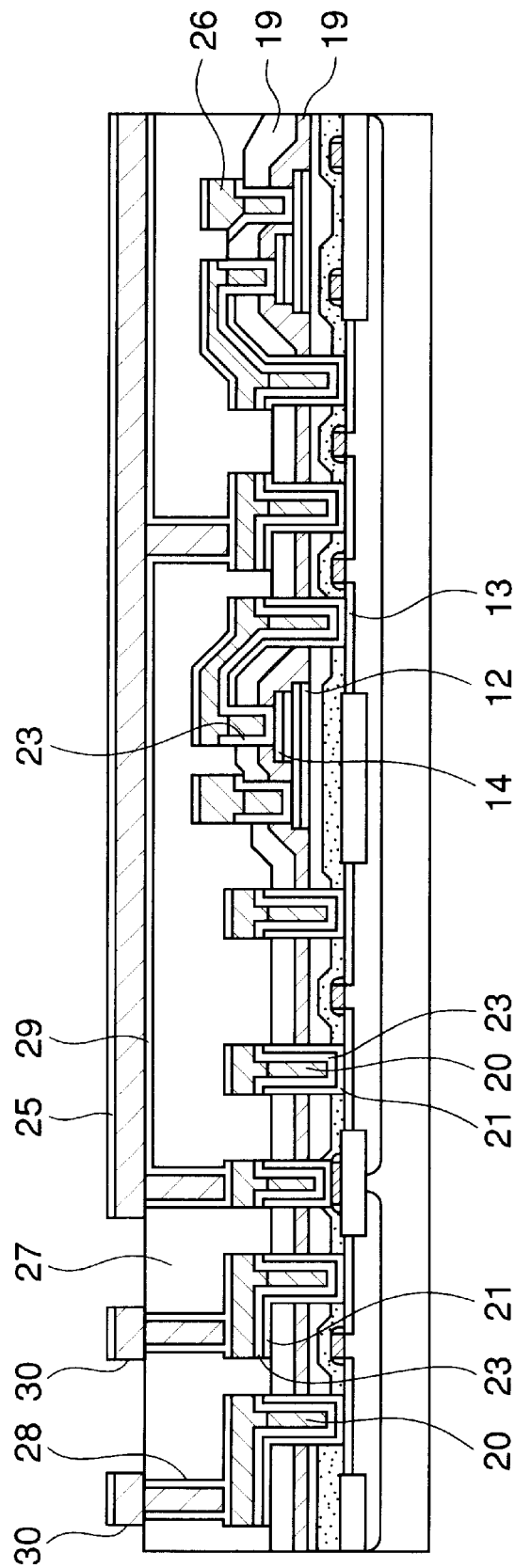
FIG. 13 is a cross-sectional view of a thirteenth step in a process according to a first embodiment of the present invention.

Furthermore, as shown in FIG. 13, a wiring interlayer insulating film 27 may be grown by forming a silicon oxide film having a thickness of 300 nm via a thermal CVD method which uses TEOS and ozone as raw materials and by forming a silicon oxide film having a thickness of 500 nm via a plasma CVD method in which TEOS is thermally decomposed in oxygen plasma. Then, a through hole 28 which extends to the first layer Al wiring 26 may be formed by using a plasma gas that does not generate a reducing gas such as $CF_4$. Afterwards, a Ti film having a thickness of 150 nm may be grown to produce a second adhesive film 29, and a second layer Al wiring 30 having a thickness of 500 nm may be grown over the adhesive film 29. Also, the Al wiring 30 may be embedded in the through hole via a high-temperature aluminum sputtering method in which the substrate temperature is 400 to 480° C. Then, a reflection preventing film 25 may be formed over the second layer Al wiring 30, and the film 25 and second wiring 30 may be dry-etched while using a photoresist as a mask.

In general, tungsten is used as the metal which is embedded in the though hole 28 during a CVD method. For example, in a tungsten-CVD method, the substrate temperature may be set to 380 to 450° C., and $WF_6$ may be reduced by silane and hydrogen using a mixed gas consisting of $WF_6$, $SiH_4$, and $H_2$ to make the tungsten grow. In such a situation, the PZT film 13 of the capacitor 16 is reduced and deteriorated. Accordingly, the present invention implements a method in which the Al metal wiring 30 is embedded in the through hole 28 via a high-temperature sputtering method. Also, a method for embedding wiring 30 in the through hole 28 besides a metal CVD method which uses a reducing gas can be used. For example, a high-pressure sputtering method can be used in which aluminum is embedded in the through hole 28 by raising the temperature and pressure after an aluminum film has been grown under a high vacuum. Also, the wiring metal used in the above methods is not limited to aluminum. For example, a copper reflow sputtering method may be used.

As described above, a capacitor 16 in which a PZT film 13 is used as a metal oxide dielectric is formed. However, bismuth titanate or $BiSr_2Ta_2O_9$ (SBT) may be used instead of PZT. Alternatively, a high dielectric film such as a (Ba, Sr) $TiO_3$ film or a $Ta_2O_5$ film may be employed. Furthermore, instead of forming the capacitor electrodes 12 and 14 from Pt, Ir or Ru may be used.

FIGS. 14–18 illustrate a second embodiment of a semiconductor capacitor in which an SBT film is used as a dielectric film. In contrast to a PZT film, the SBT film is not sensitive to diffusion of Ti from the upper capacitor electrode, and thus, it is applicable to a case in which a Ti adhesive film may exist on the upper capacitor electrode.

Figure 14:
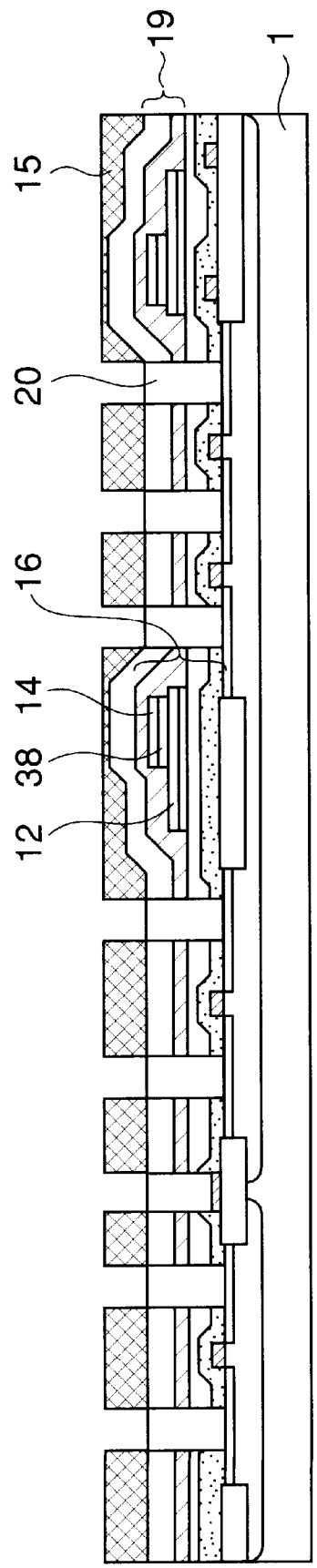
FIG. 14 is a cross-sectional view of a first step in a process according to a second embodiment of the present invention.

As shown in FIG. 14, a patterned photoresist 15 is formed over a capacitor cover insulating film 19 which covers a ferroelectric capacitor 16 comprising of a SBT film 38 interposed between a Pt lower capacitor electrode 12 and a Pt upper capacitor electrode 14. Then, first contact holes (i.e. transistor contact holes) 20 are formed in the insulating film 19.

Figure 15:
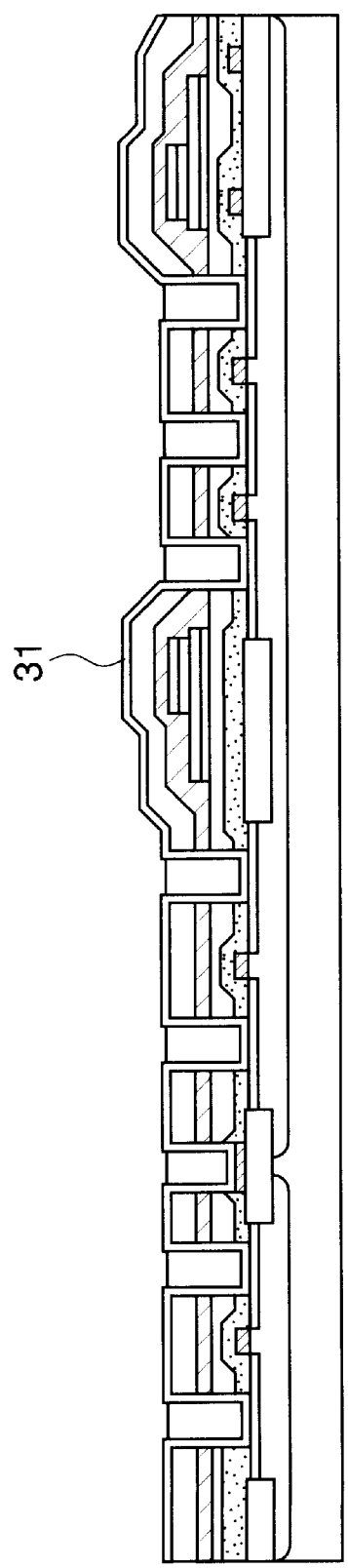
FIG. 15 is a cross-sectional view of a second step in a process according to a second embodiment of the present invention.

As shown in FIG. 15, the photoresist pattern 15 is made into ash and removed, and an SPM cleaning process and an APM cleaning process is conducted. During such processes, the bottom portion of the first contact holes 20 is cleaned. Afterwards, a protective silicon oxide film 31 having a thickness of 30 nm is formed via a thermal CVD method. The protective silicon oxide film 31 helps maintain the degree of cleanliness of the bottom portion of the first contact holes 22 which has been subjected to the SPM and APM cleaning processes. Then, contact ions (e.g. phosphorus, arsenic, or boron) are implanted into the first contact holes 20.

Figure 16:
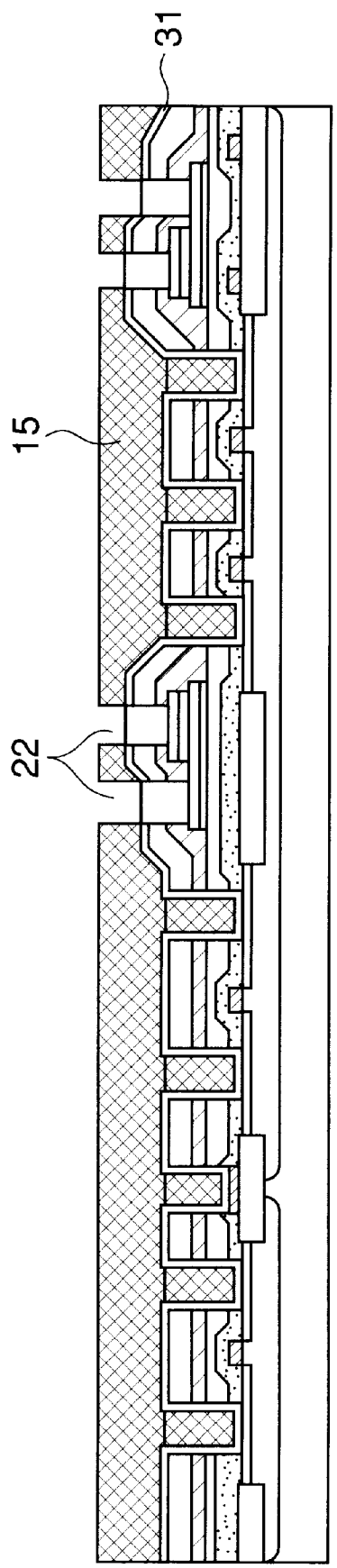
FIG. 16 is a cross-sectional view of a third step in a process according to a second embodiment of the present invention.

Afterwards, as shown in FIG. 16, a patterned photoresist 15 is formed on the protective silicon oxide film 31, and second contact holes (i.e. capacitor contact holes) 22 are formed via a dry etching process using a non-reducing gas. Subsequently, the photoresist 15 is removed by exposing it to oxygen radicals, and the protective silicon oxide film 31 is removed by a diluted hydrofluoric acid aqueous solution.

Figure 17:
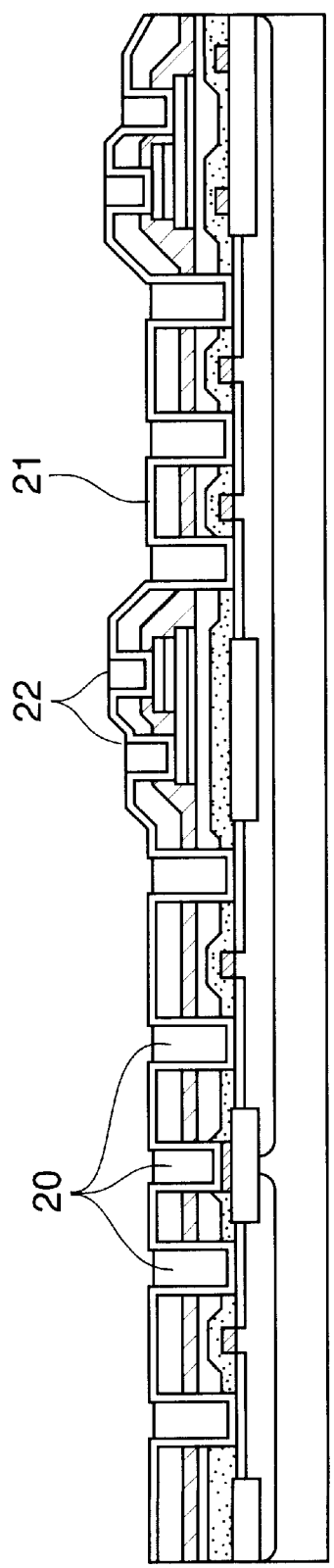
FIG. 17 is a cross-sectional view of a fourth step in a process according to a second embodiment of the present invention.

As shown in FIG. 17, a laminate film 21 comprising a Ti adhesive layer having a thickness of 15 nm and a first barrier film (i.e. a TiN film) having a thickness of 50 nm is grown over the entire surface via a sputtering process. Then, the TiN film is refined by performing a lamp annealing process at 650° C. for 30 seconds in a nitrogen atmosphere.

Figure 18:
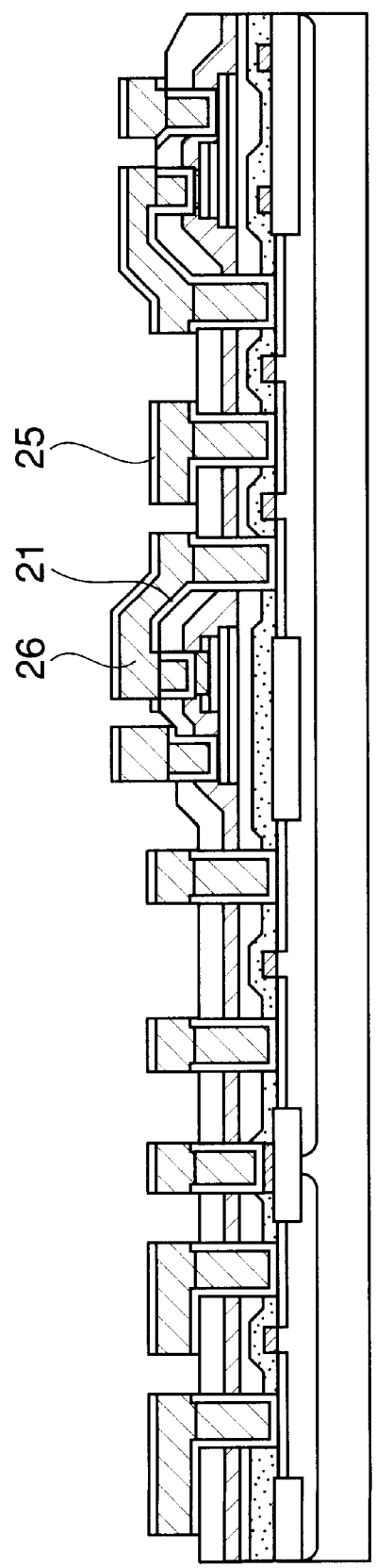
FIG. 18 is a cross-sectional view of a fifth step in a process according to a second embodiment of the present invention.
Figure 19:
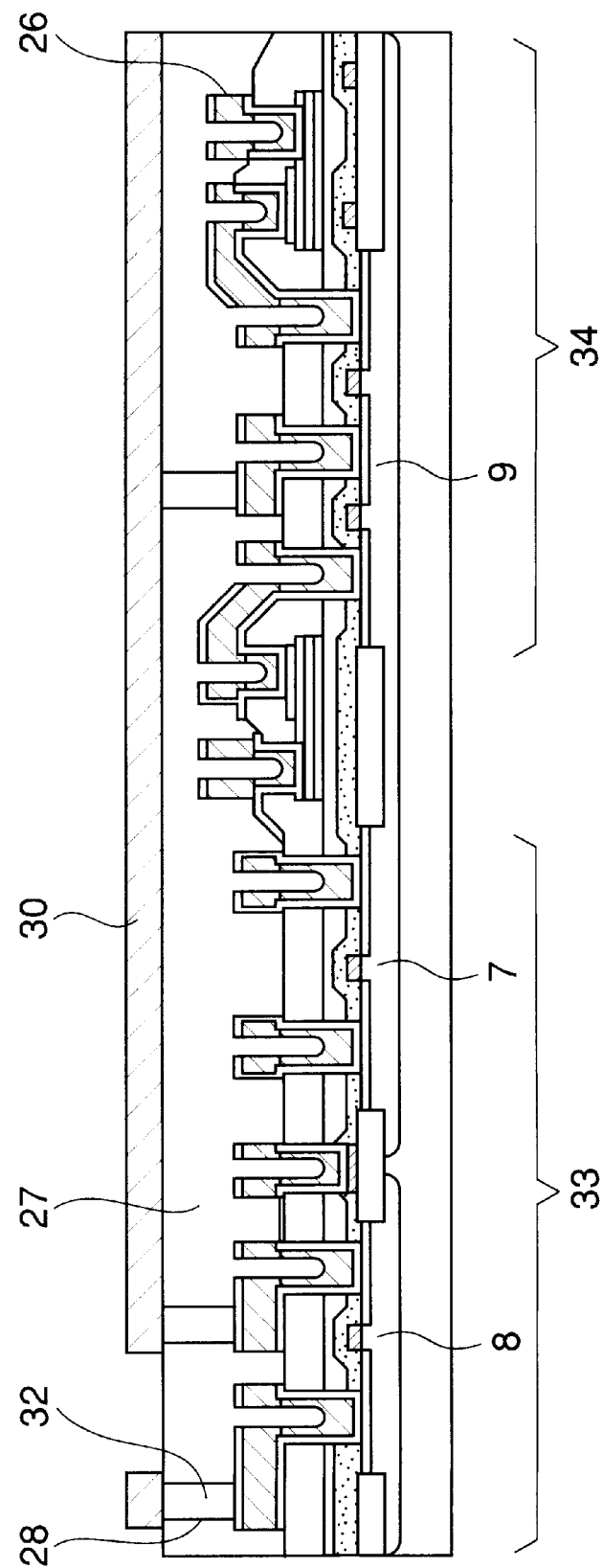
FIG. 19 is a cross-sectional view of a first step in a process according to a first conventional example.
Figure 20:
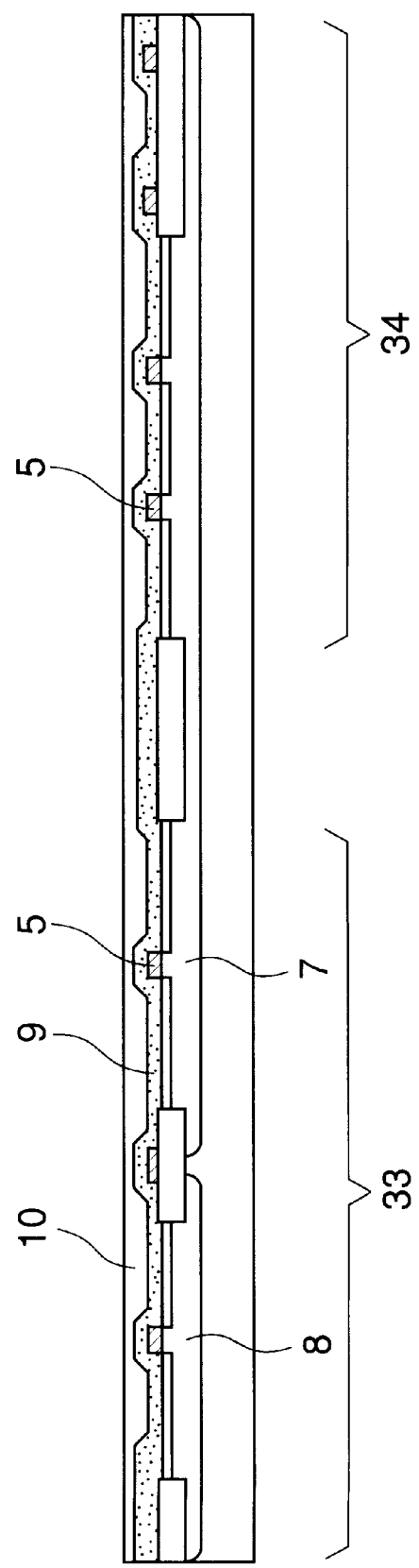
FIG. 20 is a cross-sectional view of a second step in a process according to a first conventional example.
Figure 21:
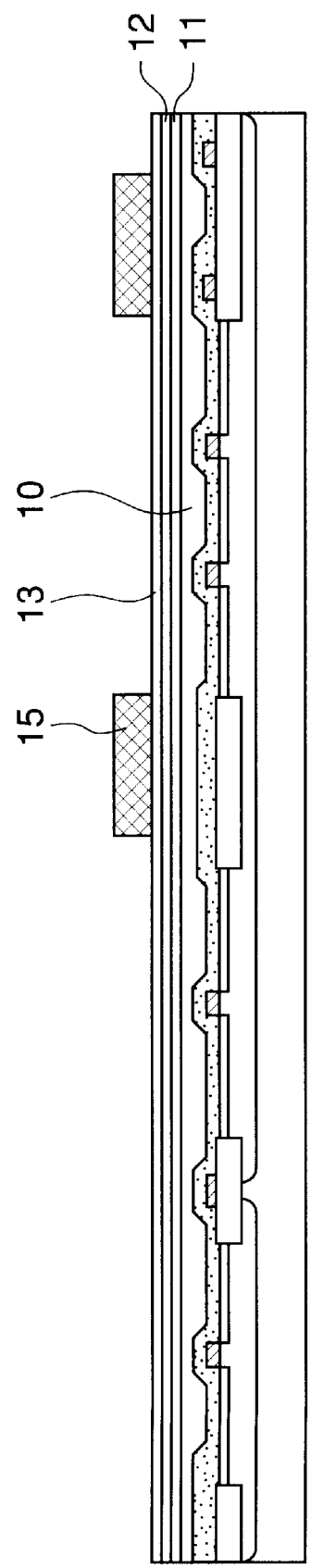
FIG. 21 is a cross-sectional view of a third step in a process according to a first conventional example.
Figure 22:
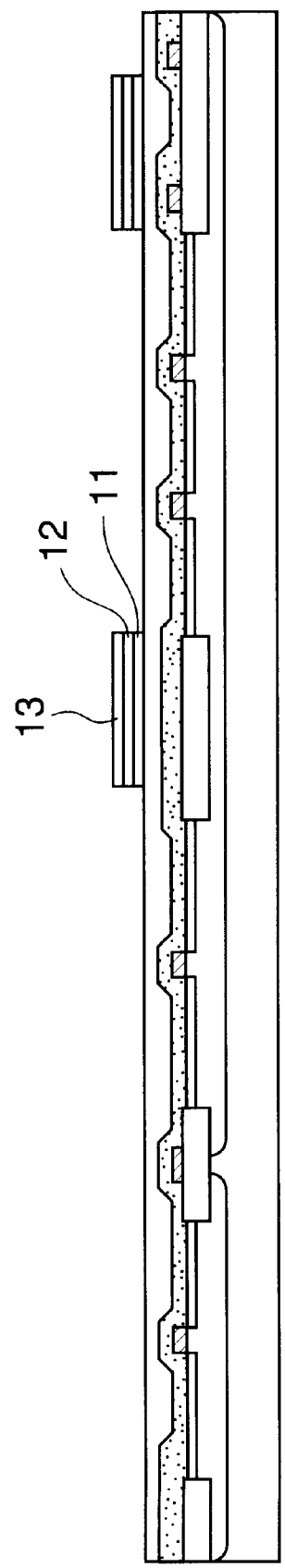
FIG. 22 is a cross-sectional view of a fourth step in a process according to a first conventional example.
Figure 23:
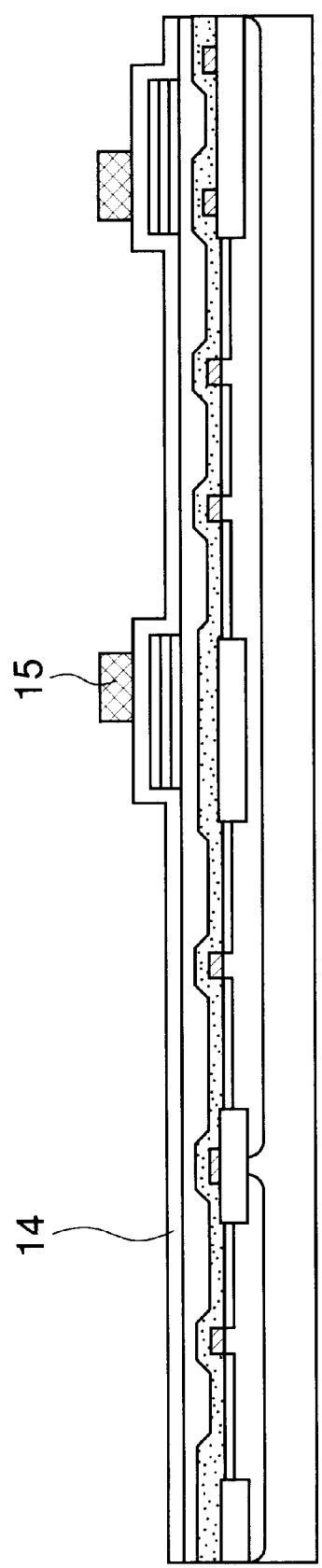
FIG. 23 is a cross-sectional view of a fifth step in a process according to a first conventional example.
Figure 24:
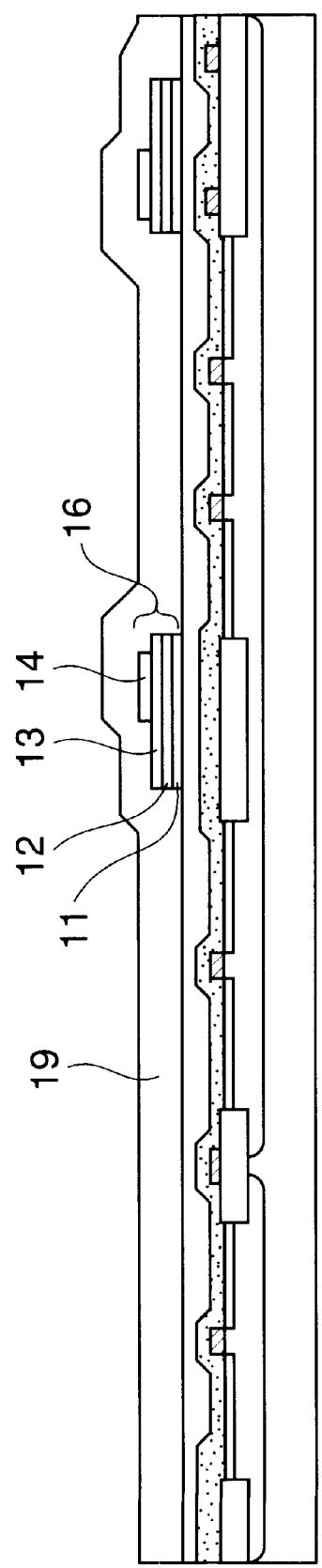
FIG. 24 is a cross-sectional view of a sixth step in a process according to a first conventional example.
Figure 25:
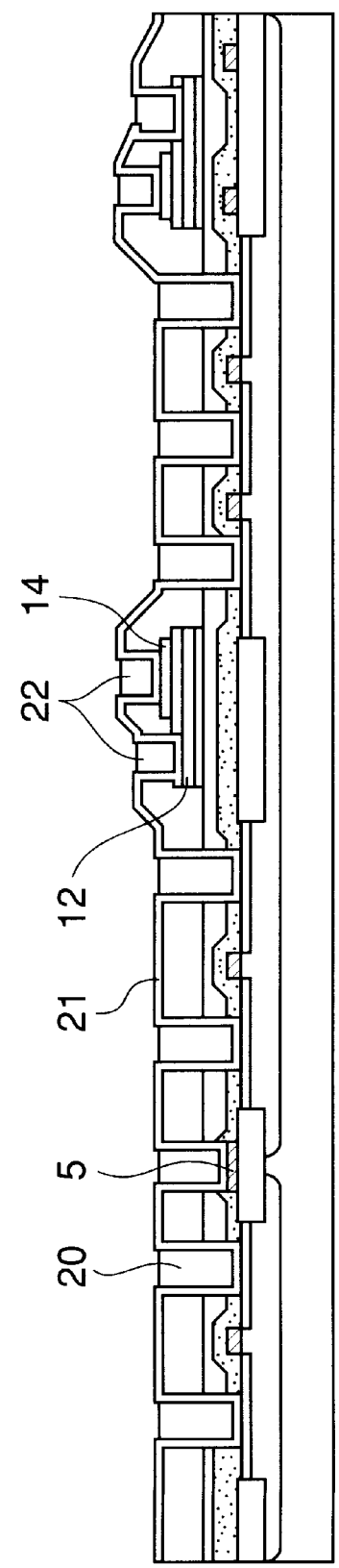
FIG. 25 is a cross-sectional view of a seventh step in a process according to a first conventional example.
Figure 26:
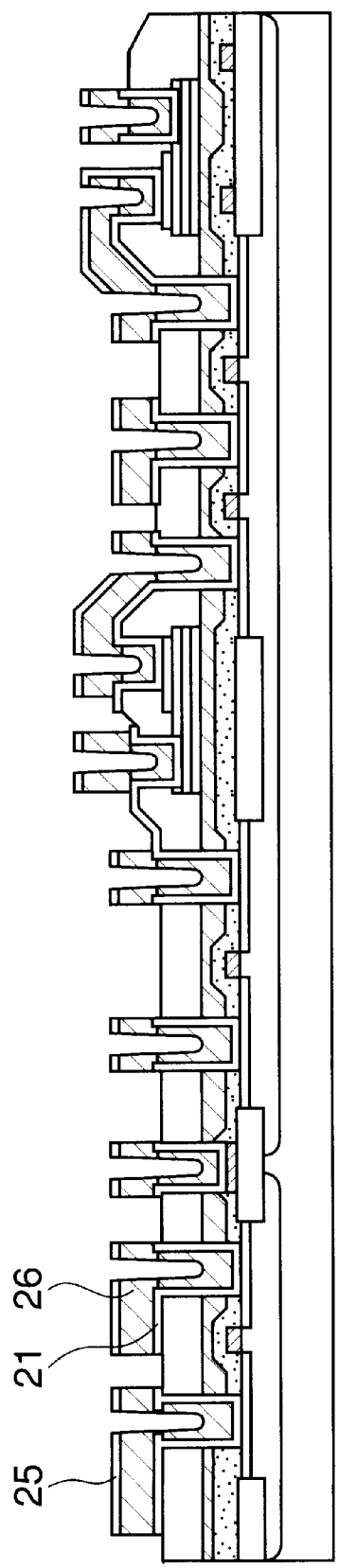
FIG. 26 is a cross-sectional view of a eighth step in a process according to a first conventional example.
Figure 27:
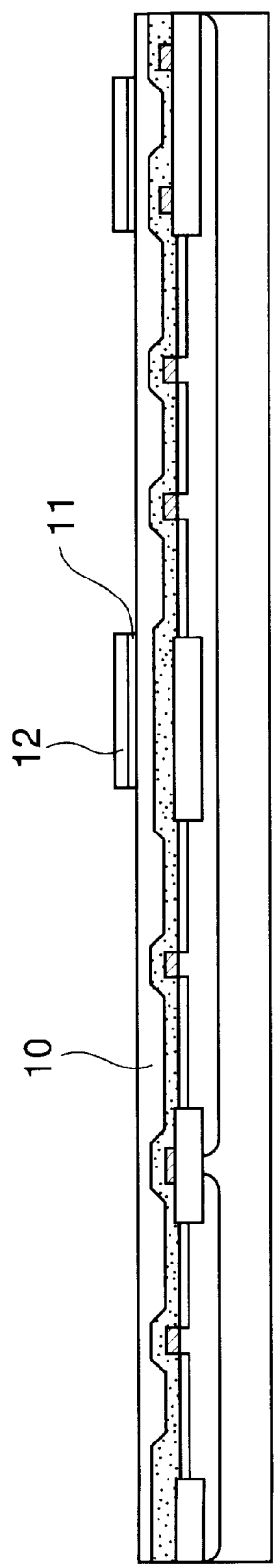
FIG. 27 is a cross-sectional view of a first step in a process according to a second conventional example.
Figure 28:
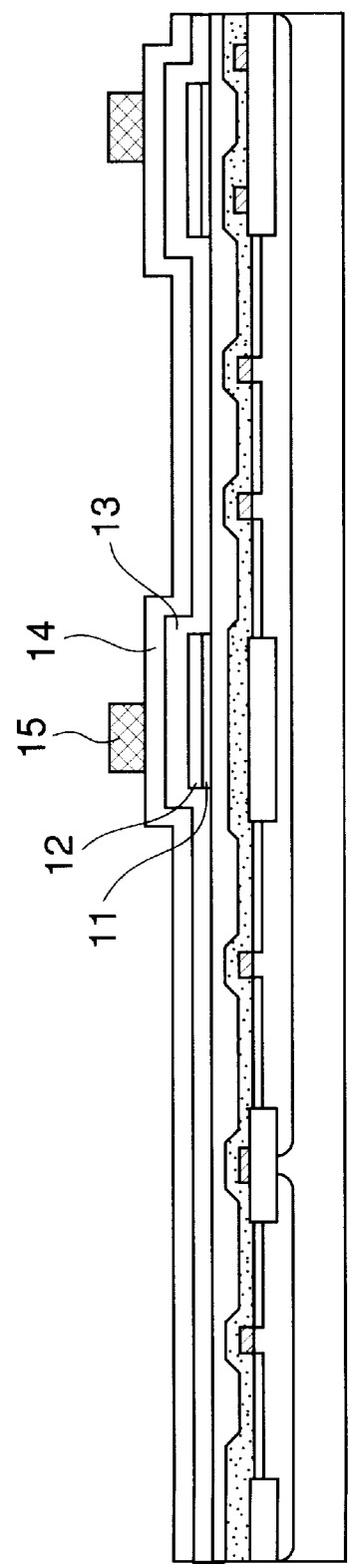
FIG. 28 is a cross-sectional view of a second step in a process according to a second conventional example.
Figure 29:
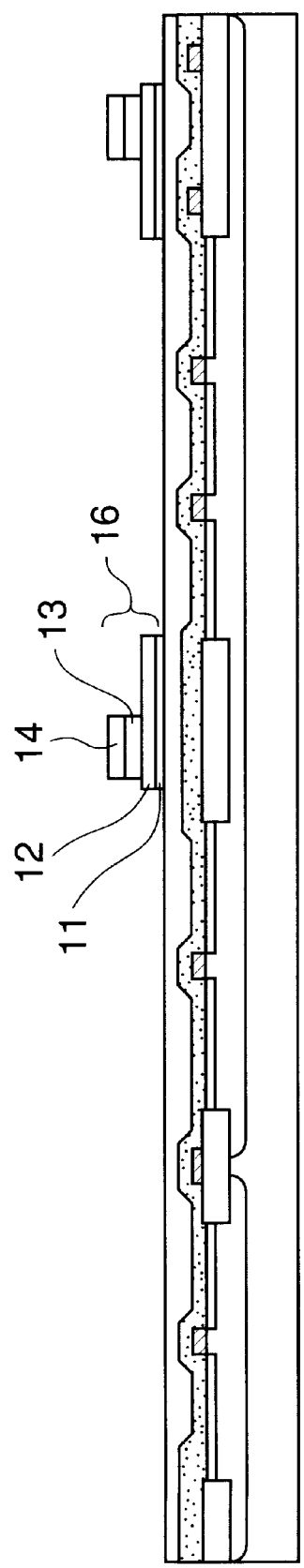
FIG. 29 is a cross-sectional view of a third step in a process according to a second conventional example.
Figure 30:
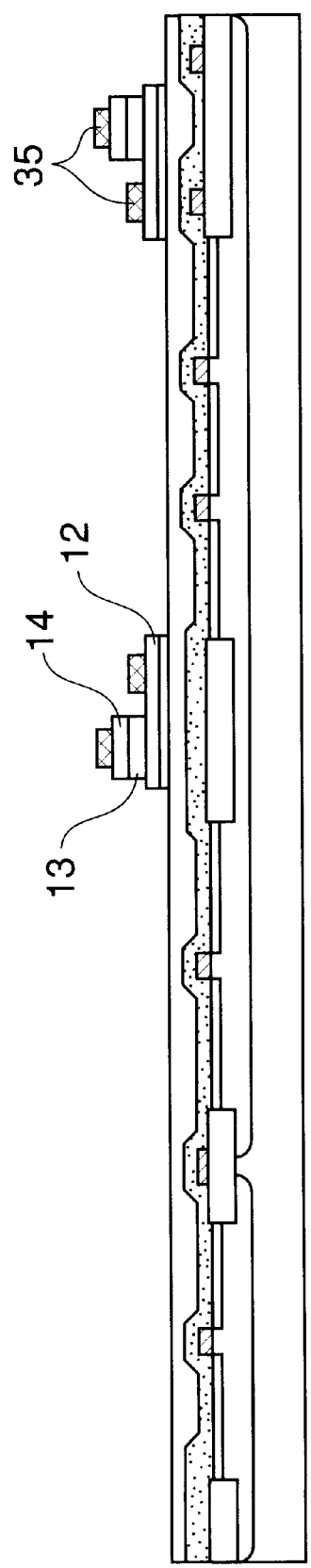
FIG. 30 is a cross-sectional view of a fourth step in a process according to a second conventional example.
Figure 31:
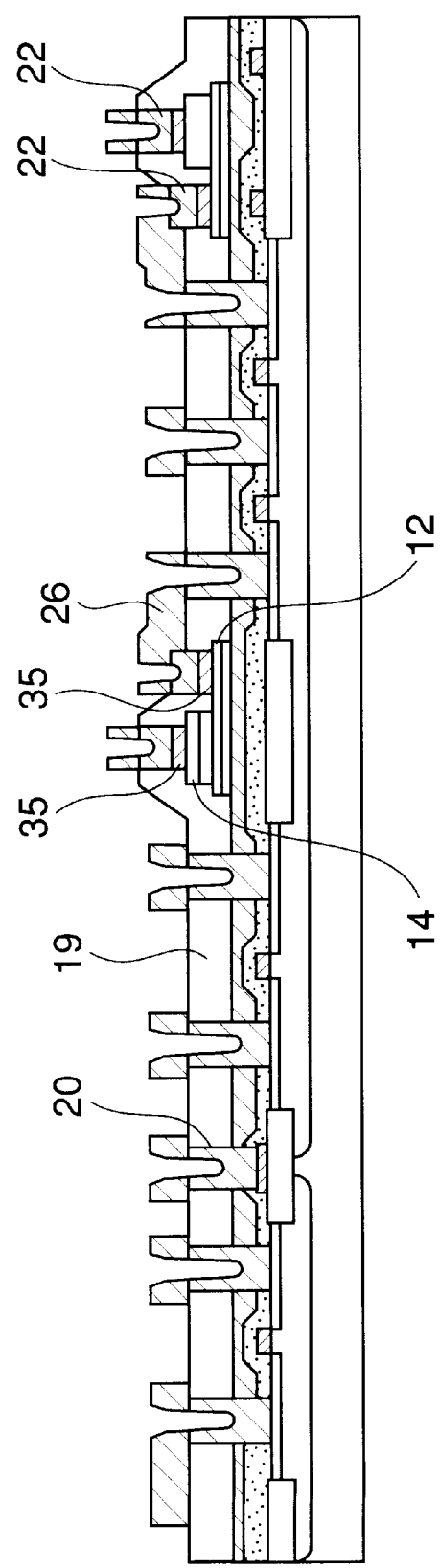
FIG. 31 is a cross-sectional view of a fifth step in a process according to a second conventional example.
Figure 32:
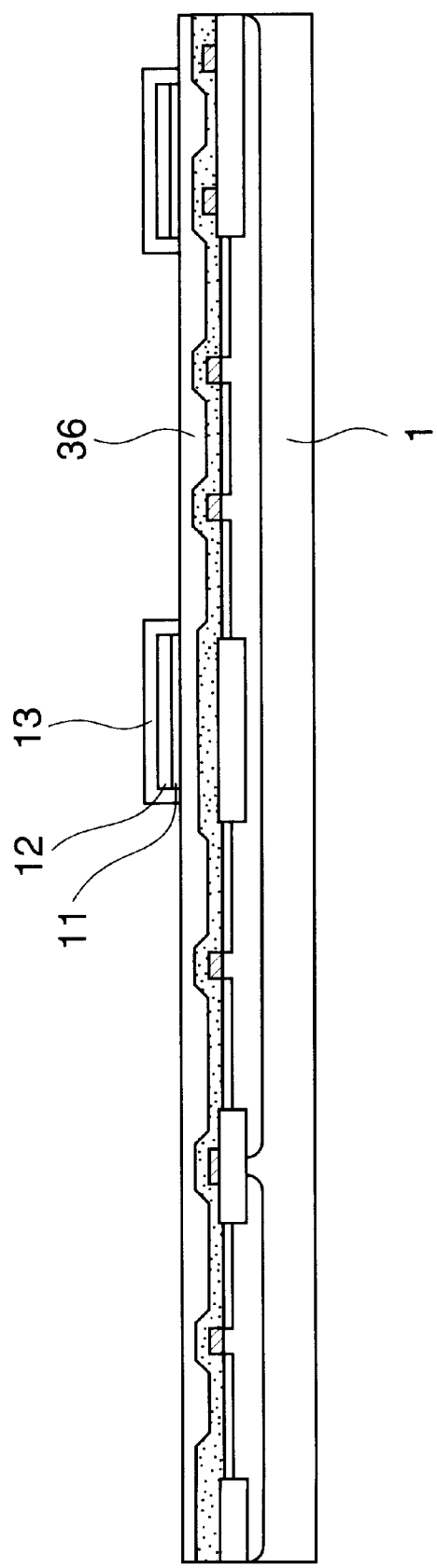
FIG. 32 is a cross-sectional view of a first step in a process according to a third conventional example.
Figure 33:
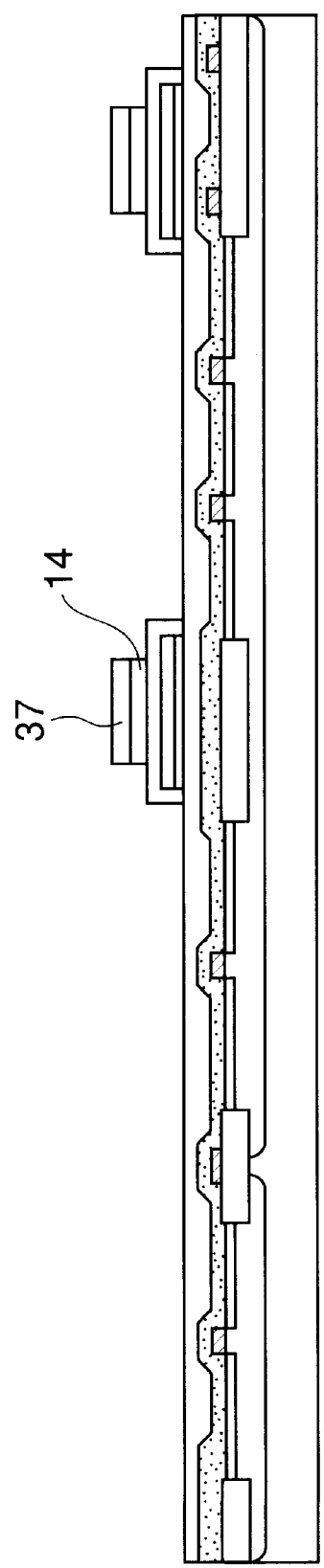
FIG. 33 is a cross-sectional view of a second step in a process according to a third conventional example.
Figure 34:
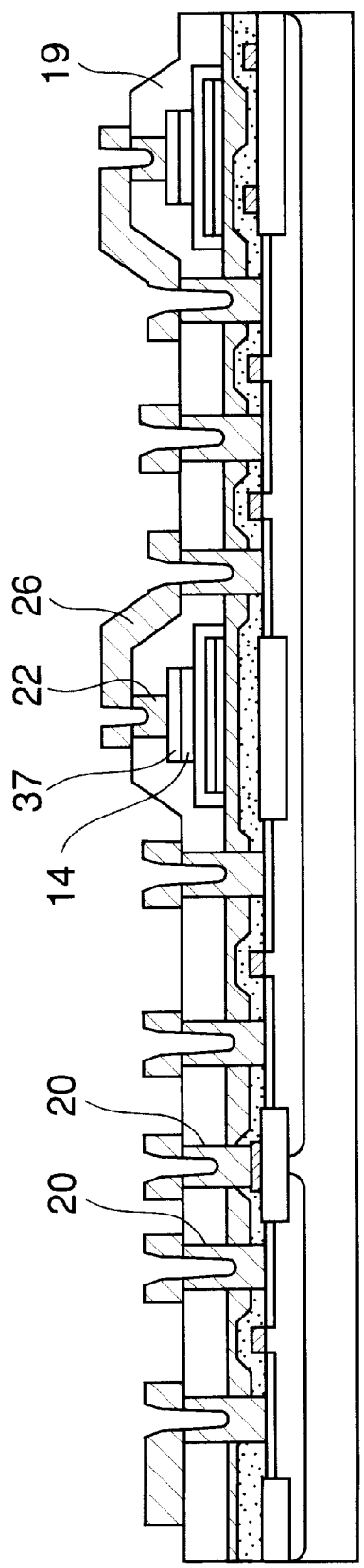
FIG. 34 is a cross-sectional view of a third step in a process according to a third conventional example.

Afterwards, as shown in FIG. 18, an Al—Cu film 26 is grown over the laminate film 21 while embedding the film 26 in the first contact holes 20 and the second contact holes 22. The film 26 is embedded via a high-temperature sputtering method at substrate temperature of 450° C. Then, a reflection preventing film 25 having a thickness of 50 nm is formed over the entire surface via a sputtering process.

Subsequently, a patterned photoresist (not shown) is formed over the entire surface, and the reflection preventing film 25, the Al—Cu film 26, and the laminate film 21 are etched with a chlorine gas to form the Al wiring 26.

As illustrated by the embodiments above, the present invention has many advantages. For example, the Ti adhesive film and the TiN barrier film contained in the laminate film 21, which adhere very well to the lower silicon layer, are formed at the bottom portion of the first contact hole 21 that extends to the MOS transistor. On the other hand, only the TiN barrier film 23, which contains no metal components that diffuse into the Pt capacitor electrode films 12 and 14, exists at the bottom portion of the second contact holes 22 that extend to the capacitor 16. As a result, metal components do not diffuse into the electrode films 12 and 14, and the characteristics of the capacitor are not deteriorated.

Also, the first contact holes 20 which extend to the MOS transistor are formed with a dry etching gas that is high in selectivity with respect to the lower silicon layer. On the other hand, the second contact holes 22 which extend to the Pt capacitor electrode films 12 and 14 are subsequently formed via a dry etching process in which no reducing gases are used. As a result, the dielectric films in the capacitor 16 are not reduced, and the deterioration of the capacitor 16 is prevented.

In addition, the SPM and APM cleaning processes can be safely performed after forming of the first contact holes 20 without deteriorating the semiconductor device since the capacitor 16 is protected by the insulating film 19. Thus, the under silicon layer surface can be cleaned to remarkably improve the reliability of its connection to the aluminum wiring.

Also, the photoresist that forms an etching mask is only exposed to oxygen radicals when it is made into ash and removed. Therefore, the capacitor 16 is not deteriorated by damaging the metallic oxide capacitor 16 with oxygen ions.

As explained above, a semiconductor device of the present invention ensures a reliable connection between the metal wiring and the MOS transistor and enables the metal wiring to be connected to the capacitor electrode films without deteriorating the metal oxide dielectric film of the capacitor. Also, since a metal CVD method which uses a gas that decomposes into a hydrogen gas is not used to form the wiring, a multilayer wiring structure can be formed without deteriorating the metal oxide dielectric capacitor. As a result, for example, a nonvolatile memory built-in microprocessor containing about 4 to 6 layers of ferroelectric memories and large-scaled CMOS logic which are connected through a multilayer wiring structure can be reliably manufactured.

The previous description of the preferred embodiments is provided to enable a person skilled in the art to make or use the present invention. Moreover, various modifications to these embodiments will be readily apparent to those skilled in the art, and the generic principles defined herein may be applied to other embodiments without the use of inventive faculty. Therefore, the present invention is not intended to be limited to the embodiments described herein but is to be accorded the widest scope as defined by the claims.

What is claimed:

1. A semiconductor device, comprising:

a semiconductor substrate;

a transistor having a source/drain region and a gate electrode formed on said semiconductor substrate;

a capacitor having an upper capacitor electrode, a lower capacitor electrode, and a metallic oxide dielectric disposed between said upper capacitor electrode and said lower capacitor electrode;

a capacitor cover insulating film formed over said capacitor; and a first metal wiring formed over said capacitor cover insulating film;

a first composite film having a first adhesive metal film and a first metal nitride barrier film disposed at an insulating film boundary between said capacitor cover insulating film and said first metal wiring and disposed at a transistor boundary which electrically connects said transistor to said first metal wiring; and a second metal nitride barrier film formed at a capacitor boundary between said capacitor and said metal wiring, wherein said first adhesive metal film is not disposed at said capacitor boundary.

2. The semiconductor device as claimed in claim 1, wherein said metal oxide dielectric is a PZT film.

3. The semiconductor device as claimed in claim 1, wherein said capacitor cover insulating film comprises:

a thermal CVD/silicon oxide film having high hygroscopicity; and a plasma CVD/silicon oxide film disposed over said thermal CVD/silicon oxide film.

4. The semiconductor device as claimed in claim 3, wherein said thermal CVD/silicon oxide film has a thickness greater than or equal to 100 nm.

5. The semiconductor device as claimed in claim further comprising:

a transistor contact hole formed through said capacitor cover insulating film and extending to said transistor, wherein said first metal wiring is disposed in said transistor contact hole, and wherein said first adhesive metal film and said first metal nitride barrier film are disposed in said transistor contact hole between said transistor and said first metal wiring.

6. The semiconductor device as claimed in claim 5, further comprising:

a capacitor contact hole formed through said capacitor cover insulating film and extending to said capacitor, wherein said first metal wiring is disposed in said capacitor contact hole, and wherein said second metal oxide barrier film is disposed in said capacitor contact hole between said capacitor and said first metal wiring, and wherein said first adhesive metal film is not disposed in a lower half of said capacitor contact hole.

7. The semiconductor device as claimed in claim 1, further comprising:

a capacitor contact hole formed through said capacitor cover insulating film and extending to said capacitor, wherein said first metal wiring is disposed in said capacitor contact hole, and wherein said second metal nitride barrier film is disposed in said capacitor contact hole between said capacitor and said first metal wiring, and wherein said first adhesive metal film is not disposed in a lower half of said capacitor contact hole.

* * * * *